(12) United States Patent
Shah et al.

(10) Patent No.: US 8,003,513 B2
(45) Date of Patent: Aug. 23, 2011

(54) MULTILAYER CIRCUIT DEVICES AND MANUFACTURING METHODS USING ELECTROPLATED SACRIFICIAL STRUCTURES

(75) Inventors: Rajiv Shah, Rancho Palos Verdes, CA (US); Shaun Pendo, Santa Maria, CA (US)

(73) Assignee: Medtronic Minimed, Inc., Northridge, CA (US)

( * ) Notice: Subject to any disclaimer, the term of this patent is extended or adjusted under 35 U.S.C. 154(b) by 11 days.

(21) Appl. No.: 11/086,936

(22) Filed: Mar. 22, 2005

(65) Prior Publication Data

US 2005/0161826 A1 Jul. 28, 2005

Related U.S. Application Data

(63) Continuation-in-part of application No. 10/331,186, filed on Dec. 26, 2002, and a continuation-in-part of application No. 10/671,996, filed on Sep. 26, 2003, now Pat. No. 7,138,330.

(60) Provisional application No. 60/414,289, filed on Sep. 27, 2002.

(51) Int. Cl.
*H01L 21/4763* (2006.01)

(52) U.S. Cl. ........ 438/622; 257/758; 438/624; 438/618; 438/637; 438/623

(58) Field of Classification Search .................. 257/758; 438/622, 624, 618, 637, 623
See application file for complete search history.

(56) References Cited

U.S. PATENT DOCUMENTS

| | | |
|---|---|---|
| 3,224,433 A | 12/1965 | von Dalebor |
| 3,224,436 A | 12/1965 | von Dalebor |
| 3,294,653 A | 12/1966 | Keller et al. |
| 3,296,012 A | 1/1967 | Stalnecker, Jr. et al. |
| 3,379,568 A | 4/1968 | Holmes |
| 3,637,406 A | 1/1972 | Bailey |
| 3,862,017 A | 1/1975 | Tsunemitsu et al. |
| 3,988,214 A | 10/1976 | Tsunemitsu |
| 4,250,519 A | 2/1981 | Mogi et al. |
| 4,543,953 A | 10/1985 | Slocum et al. |
| 4,911,796 A * | 3/1990 | Reed ............................ 205/125 |
| 4,922,323 A | 5/1990 | Potter |
| 4,952,420 A | 8/1990 | Walters |
| 4,976,991 A | 12/1990 | Ammende et al. |

(Continued)

FOREIGN PATENT DOCUMENTS

EP 0 329 973 8/1989

(Continued)

OTHER PUBLICATIONS

Young W. Kim and Mark G. Allen, 1992 School of Electrical Engineering, Georgia Institute of Technology, Atlanta GA 30332-0250, Single- and multi-layer surface-micromachined platforms using electroplated sacrificial layers, pp. 61-68.*

(Continued)

*Primary Examiner* — Junghwa M Im
(74) *Attorney, Agent, or Firm* — Foley & Lardner, LLP

(57) ABSTRACT

A multilayer circuit includes a dielectric base substrate, conductors formed on the base substrate and a vacuum deposited dielectric thin film formed over the conductors and the base substrate. The vacuum deposited dielectric thin film is patterned using sacrificial structures formed by electroplating techniques. Substrates formed in this manner enable significant increases in circuit pattern miniaturization, circuit pattern reliability, interconnect density and significant reduction of over-all substrate thickness.

32 Claims, 15 Drawing Sheets

U.S. PATENT DOCUMENTS

| | | | |
|---|---|---|---|
| 5,108,819 | A | 4/1992 | Heller et al. |
| 5,112,699 | A | 5/1992 | Chang |
| 5,165,407 | A | 11/1992 | Wilson et al. |
| 5,231,054 | A | 7/1993 | Kosugi |
| 5,241,456 | A * | 8/1993 | Marcinkiewicz et al. .... 361/792 |
| 5,299,571 | A | 4/1994 | Mastrototaro |
| 5,322,063 | A | 6/1994 | Allen et al. |
| 5,390,671 | A | 2/1995 | Lord et al. |
| 5,391,250 | A | 2/1995 | Cheney et al. |
| 5,411,647 | A | 5/1995 | Johnson et al. |
| 5,451,804 | A | 9/1995 | Lur et al. |
| 5,586,553 | A | 12/1996 | Halili et al. |
| 5,693,577 | A | 12/1997 | Krenik et al. |
| 5,777,060 | A | 7/1998 | Van Antwerp |
| 5,786,439 | A | 7/1998 | Van Antwerp et al. |
| 5,795,545 | A | 8/1998 | Koripella et al. |
| 5,841,584 | A * | 11/1998 | Takatani et al. ............... 359/586 |
| 5,904,508 | A | 5/1999 | Codama et al. |
| 5,951,521 | A | 9/1999 | Mastrototaro et al. |
| 5,976,988 | A | 11/1999 | Konuma et al. |
| 6,032,064 | A | 2/2000 | Devlin et al. |
| 6,060,176 | A | 5/2000 | Semkow et al. |
| 6,081,182 | A | 6/2000 | Tomozawa et al. |
| 6,103,033 | A | 8/2000 | Say et al. |
| 6,162,611 | A | 12/2000 | Heller et al. |
| 6,174,804 | B1 | 1/2001 | Hsu |
| 6,184,477 | B1 | 2/2001 | Tanahashi |
| 6,197,688 | B1 | 3/2001 | Simpson |
| 6,256,206 | B1 | 7/2001 | Van Campenhout |
| 6,259,937 | B1 | 7/2001 | Schulman et al. |
| 6,262,376 | B1 * | 7/2001 | Hurwitz et al. ............... 174/255 |
| 6,309,957 | B1 | 10/2001 | Tu et al. |
| 6,328,858 | B1 | 12/2001 | Felsenthal et al. |
| 6,360,888 | B1 | 3/2002 | McIvor et al. |
| 6,369,410 | B1 | 4/2002 | Yamazaki et al. |
| 6,458,234 | B1 * | 10/2002 | Lake et al. ..................... 156/230 |
| 6,458,686 | B1 | 10/2002 | Piao |
| 6,498,043 | B1 | 12/2002 | Schulman et al. |
| 6,564,079 | B1 | 5/2003 | Cory et al. |
| 7,271,400 | B1 | 9/2007 | Shaban et al. |
| 2002/0106887 | A1 | 8/2002 | Chang |
| 2002/0122283 | A1 | 9/2002 | Higashi et al. |
| 2003/0007251 | A1 | 1/2003 | Imaizumi et al. |
| 2003/0016116 | A1 | 1/2003 | Blaha |
| 2003/0022030 | A1 | 1/2003 | Chang |
| 2003/0118797 | A1 | 6/2003 | Fluman et al. |
| 2004/0055893 | A1 | 3/2004 | Lubomirsky et al. |
| 2004/0061234 | A1 | 4/2004 | Shah et al. |
| 2005/0082636 | A1 | 4/2005 | Yashima et al. |
| 2005/0202667 | A1 * | 9/2005 | Cohen et al. .................. 438/622 |

FOREIGN PATENT DOCUMENTS

| | | |
|---|---|---|
| EP | 0 525 497 A1 | 2/1993 |
| EP | 0 529 752 A2 | 3/1993 |
| EP | 0 713 358 A2 | 5/1996 |
| EP | 1 096 838 A2 | 5/2001 |
| GB | 1102832 | 2/1968 |
| GB | 1348659 | 3/1974 |
| GB | 2 064 126 | 6/1981 |
| JP | 53-110070 A | 9/1978 |
| JP | 55-4955 | 1/1980 |
| JP | 61-111598 | 5/1986 |
| JP | 3-120791 | 5/1991 |
| JP | 04-015985 | 1/1992 |
| JP | 6-13723 | 1/1994 |
| JP | 06-132662 | 5/1994 |
| JP | 8-31932 | 2/1996 |
| JP | 10-115711 | 5/1998 |
| JP | 2001-074681 | 3/2001 |
| JP | 2001-257469 | 9/2001 |
| JP | 2002-221801 | 8/2002 |
| JP | 2002221801 | 8/2002 |
| JP | 2003-115663 | 4/2003 |
| JP | 2006-513558 | 4/2006 |
| WO | WO 89/02697 A1 | 3/1989 |
| WO | WO-98/56293 | 12/1998 |
| WO | WO-99/45375 | 9/1999 |
| WO | WO-99/45387 | 9/1999 |
| WO | WO-99/56613 A | 11/1999 |
| WO | WO 03/023388 A1 | 3/2003 |
| WO | WO-03/100846 | 12/2003 |

OTHER PUBLICATIONS

Office Action dated Apr. 14, 2009 from related Japanese patent application No. 2004-540098.

PCT International Search Report as issued in International Application No. PCT/US2006/009203, Mailing date Jul. 6, 2006.

Young W. Kim and Mark G. Allen—1992 School of Electrical Engineering, Georgia Institute of Technology, Atlanta GA 30332-0250—*Single—and multi-layer surface-micromachined platforms using electroplated sacrificial layers*. pp. 61-68.

Office Action issued on Jul. 15, 2008 from related Japanese patent application 2006-528019.

Non-Final Office Action dated Apr. 22, 2009 from related U.S. Appl. No. 11/395,457.

Decision of Rejection dated Apr. 7, 2009 for related Japanese patent application No. 2006-528019.

3M Specifications and Design Guidelines, Microflex circuits for IC Interconnect Solutions, 1D pp. 1-32 (the entire document), 1997 (3M Electronic Products Division, Austin, TX).

Micron Wide Conductors and Spaces on 26 PZT, Alumina, Glass and Flexible Materials 1D 1 page, no date (Metrigraphics, Wilmington, MA).

3M Offers More Solutions for the Semiconductor Industry 1D the entire document, 1997 (3M Electronic Products Division, Austin TX).

Examiners Report dated Mar. 11, 2010 from related Canadian patent application No. 2539280.

Office Action dated Jul. 21, 2009 issued in related U.S. Appl. No. 11/868,898.

Office Action dated Nov. 16, 2010 from related Japanese Patent Application No. 2009-13548.

Search Report dated May 4, 2004 from related PCT International application No. PCT/US03/29224.

US Notice of Allowance dated Jun. 24, 2010 from related U.S. Appl. No. 11/868,898.

Dr. J. Prymak; Dr. S. Bhattacharya & Prof. K. Paik—Fundamentals of Passives: Discrete Integrated, and Embedded (Ch. 11)—Fundamentals of Microsystems Packaging, 2000.

EP Search Report as issued in International Application No. 03754668.6 2214, Mailing date Oct. 17, 2005.

Final Office Action received for U.S. Appl. No. 09/779,282 dated Feb. 11, 2004.

Final Office Action received for U.S. Appl. No. 10/331,186 dated Feb. 8, 2007.

Final Office Action received for U.S. Appl. No. 10/331,186 dated Nov. 16, 2005.

Final Office Action received for U.S. Appl. No. 11/030,235 dated Aug. 22, 2007.

Final Office Action received for U.S. Appl. No. 11/030,235 dated Jul. 1, 2008.

Final Office Action received for U.S. Appl. No. 11/030,235 dated Nov. 10, 2005.

Final Office Action received for U.S. Appl. No. 11/030,235 dated Nov. 6, 2006.

Final Office Action received for U.S. Appl. No. 11/395,457 dated Nov. 17, 2008.

Flexible Circuits at Extreme Density 1D, 8 unnumbered pages of various dates (Metrigraphics, Wilmington, MA).

Koudelka, M. et al., 1CIn-vivo Behaviour of Hypodermically Implanted Microfabricated Glucose Sensors 1D, Biosensors & Bioelectronics 6 (Elsevier Science Publishers Ltd., England 13 1991), pp.31-36.

Koudelka, M. et al., 1CPlanar Amperometric Enzyme-Based Glucose Microelectrode 1D Sensors and Actuators, 18 (Elsevier Sequoia, The Netherlands 13 1989), pp. 157-165.

Mastrototaro, John M. et al., 1CAn electroenzymatic glucose sensor fabricated on a flexible substrate 1D, Sensors and Actuators B. 5 (Elsevier Sequoia 13 1991), pp. 139-144.

Metrigraphics Ion Bean Etching Capability, 1 page, no date (Metrigraphics, Wilimington MA).

Microflex Solutions from 3M 1D the entire document, 1996 (3M Electronic Products Division, Austin TX).

Non-final Office Action received for U.S. Appl. No. 09/779,282 dated Jan. 13, 2005.

Non-final Office Action received for U.S. Appl. No. 09/779,282 dated Jun. 23, 2003.

Non-final Office Action received for U.S. Appl. No. 10/331,186 dated Jul. 11, 2006.

Non-final Office Action received for U.S. Appl. No. 10/331,186 dated Jul. 26, 2004.

Non-final Office Action received for U.S. Appl. No. 10/671,996 dated Aug. 22, 2005.

Non-final Office Action received for U.S. Appl. No. 10/845,002 dated Apr. 14, 2006.

Non-final Office Action received for U.S. Appl. No. 10/845,002 dated Jan. 8, 2007.

Non-final Office Action received for U.S. Appl. No. 10/845,002 dated Jul. 27, 2005.

Non-final Office Action received for U.S. Appl. No. 11/030,235 dated Apr. 11, 2007.

Non-final Office Action received for U.S. Appl. No. 11/030,235 dated Jan. 9, 2008.

Non-final Office Action received for U.S. Appl. No. 11/030,235 dated Jul. 10, 2006.

Non-final Office Action received for U.S. Appl. No. 11/030,235 dated Jun. 24, 2005.

Non-final Office Action received for U.S. Appl. No. 11/395,457 dated Mar. 31, 2008.

Non-final Office Action received for U.S. Appl. No. 11/395,457 dated Oct. 12, 2007.

Notice of Allowance (1st) received for U.S. Appl. No. 10/671,996 dated Apr. 21, 2006.

Notice of Allowance (2nd) received for U.S. Appl. No. 10/671,996 dated Aug. 25, 2006.

Notice of Allowance received for U.S. Appl. No. 09/779,282 dated Nov. 15, 2005.

Notice of Allowance received for U.S. Appl. No. 10/845,002 dated Jul. 9, 2007.

Notice of Allowance received for U.S. Appl. No. 11/030,235 dated Jan. 22, 2009.

Notice of Allowance received for U.S. Appl. No. 11/395,457 dated Nov. 13, 2009.

Office Action received for Canadian Appln. No. 2,539,280 dated Nov. 19, 2009.

Office Action received for EP 03754668.6 dated Feb. 2, 2006.

Office Action received for EP 04782987.4 dated Sep. 18, 2007.

Supplementary Search Report received for EP 3754668.6 dated Oct. 17, 2005.

Translation of Decision of Rejection received for JP 2006-528019 sent Apr. 28, 2009.

Urban, G. et al., 1CMiniaturized multi-enzyme biosensors integrated with ph sensors on flexible polymer carriers for in vivo applications 1D, Biosensors & Bioelectronics 7 (Elsevier Science Publishers Ltd. 13 1992, pp. 733-739.

Young W. Kim, et al.; Single-and multi-layer surface-micromachined platforms using electroplated sacrificial layers; Sensor and Actuators (Trandsucers '91) Jun. 24-28, 1991, San Francisco, CA, USA.

PCT International Search Report as issued in International Application No. PCT/USO4/028600, Mailing date Mar. 16, 2005.

Dr. J. Prymak; Dr. S. Bhattacharya & Prof. K. Paik—*Fundamentals of Passives: Discrete Integrated, and Embedded* (CH. 11)—Fundamentals of Microsystems Packaging, 2001.

T. Remmel; P. Zurcher; M. Kim; M. Miller; M. Raymond; S. Straub; M. Tarabbia; R. Steimle & P. Chu—*Integration of Thin-Film Capacitors and Resistors into ULSI Technology for Wireless Applications*—Passive Compnent Industry, Jan./Feb. 2001.

CH 6—*Thermal Transducers*—Micromachined Transducers Soucebook, 1998.

J.J. Licari—*Thin and Thick Films* (CH. 8), 1998.

Dr. J. Prymak; Dr. S. Bhattacharya & Prof. K. Paik—*Fundamentals of Passives: Discrete Integrated, and Embedded* (CH. 11 )—Fundamentals of Microsystems Packaging, 2001.

Copy of Office Action dated Mar. 29, 2011 from related Japanese Patent Application No. 2009-175975.

\* cited by examiner

Top

Section

Bottom

Top

Section

Bottom

Top

Section

Bottom

Top

Section

Bottom

Top

Section

Bottom

Top

Section

Bottom

Top

Section

Bottom

Top

Section

Bottom

MULTILAYER CIRCUIT DEVICES AND MANUFACTURING METHODS USING ELECTROPLATED SACRIFICIAL STRUCTURES

RELATED APPLICATIONS

This application is a continuation-in-part application that claims priority under 35 USC §120 from U.S. patent application Ser. No. 10/671,996, filed 26 Sep. 2003, which claims priority under 35 USC §119(e) from U.S. Provisional Application Ser. No. 60/414,289, filed 27 Sep. 2002, entitled "Multilayer Substrate;" and is a continuation-in-part application of U.S. patent application Ser. No. 10/331,186, filed 26 Dec. 2002, entitled "Multilayer Substrate," the entirety of each of which is incorporated herein by reference and forms a basis for priority.

In addition, this application is related to U.S. patent application Ser. No. 10/038,276, filed 31 Dec. 2001, entitled "Sensor Substrate and Method of Fabricating Same," the entirety of which is incorporated herein by reference.

BACKGROUND

1. Field of the Invention

Embodiments of the invention relate to multilayer electronic devices and methods for fabrication of multi-layer electronic devices in which electroplated sacrificial structures are used during fabrication to pattern certain dielectric or other material in one or more layers. Particular embodiments of the invention relate to highly stable multilayer electronic devices and methods of fabrication thereof, for use in caustic or sensitive environments, such as medical and implant environments, in which the material used for a patterned dielectric or other patterned layers in the device are selected, in part, for suitable environmental compatibility.

2. Description of Related Art

A variety of multilayer electronic structures comprised of multiple layers of conductors interposed between multiple layers of dielectric material have been developed for various purposes. For multilayer electronic structures used in caustic or senstitive environments, the materials selected for the dielectric layer or other layers in the multilayer electronic structure preferably not only have suitable electrical characteristics to provide an intended electrical function, but also have suitable characteristics to be compatible with the environment. However, such environmentally compatible materials can, in some contexts, present manufacturing difficulties.

For example, materials traditionally considered compatible (or inert) with respect to certain medical or biological environments may have physical characteristics that render them incapable or impractical to form in layers of suitably precise patterns or suitably large spanses, using traditional multilayer device manufacturing techniques. Materials, such as Al2O3 (alumina) may have suitable dielectric characteristics and may be suitably compatible (or inert) with respect to medical or biological environments. However, traditionally, alumina has been difficult to form in precise patterns.

To address such problems, example processes for patterning alumina by using sacrificial structures formed by shadow masking techniques are described in U.S. patent application Ser. No. 10/671,996, filed 26 Sep. 2003, which is incorporated herein by reference. Shadow masking techniques typically employ machined, laser-drilled masks for defining the pattern of deposition of the patterned layer material. Because of the cost and physical limitations of such masks and laser drilling proceses, shadow masking techniques can be impractical for forming certain pattern shapes or precision details in patterned layers. Also, shadow masking techniques can be impractical for forming patterns in large spanses, such as for large devices or for forming multiple devices simultaneously (such as a multiple-device wafer that is cut into separate devices after formation of the wafer).

Multiple layer circuit devices and processes of making such devices using ceramic substrate materials as described in the above-referenced U.S. patent application Ser. No. 10/671, 996 and embodiments included herein are distinguished from silicon-based muli-layer devices in which doped regions of silicon are connected by layers having conductive material. In contrast to silicon based devices, ceramic-based multiple layer circuit devices as described in the above-referenced U.S. patent application Ser. No. 10/671,996 and embodiments included herein may be configured with thick film layers, thin film layers or combinations of thick and thin film layers.

Other multilayer substrates are conventionally fabricated by lamination techniques in which metal conductors are formed on individual dielectric layers, and the dielectric layers are then stacked and bonded together. However, various conventional lamination techniques have limitations that restricts their usefulness. For example, high temperature ceramic co-fire (HTCC) lamination techniques form conductors on "green sheets" of dielectric material that are bonded by firing at temperatures in excess of 1500 degrees C. in a reducing atmosphere. The high firing temperature precludes the use of noble metal conductors such as gold and platinum. As a result, substrates formed by high temperature processing are limited to the use of refractory metal conductors such as tungsten and molybdenum, which have very low resistance to corrosion in the presence of moisture and are therefore not appropriate for use in certain environments.

Low temperature ceramic co-fire (LTCC) techniques also utilize green sheets of ceramic materials. However the dielectric materials used in low-temperature processes are generally provided with a high glass content and therefore have relatively poor resistance to environmental corrosion, as well as a relatively low dielectric constant and relatively poor thermal conductivity.

Thick film (TF) techniques form multilayer substrates by firing individual dielectric layers and then laminating the layers to form a multilayer stack. However, thick film techniques require the use of relatively thick dielectric layers and thus it is difficult to produce a thin film multilayer device or a device having a combination of thick and thin film layers using traditional thick film processing techniques. Thick film dielectrics also have relatively low dielectric constants, relatively poor thermal conductivity, and poor corrosion resistance.

In addition to the problems listed above, the conventional lamination techniques cannot use green sheets of less than 0.006 inches in thickness because thinner green sheets cannot reliably survive necessary processing such as drilling or punching of via holes. Also, because the designer has limited control over the thickness of individual green sheets, the number of layers of the multilayer substrate is often limited according to the maximum allowable substrate thickness for the intended application. Thus, where a thin multilayer substrate device is desired or a multilayer substrate device having both thick and thin layers, lamination techniques generally do not provide optimal results.

In addition, the firing required in the conventional lamination techniques can cause shrinkage in excess of 10% in both dielectric and conductor materials, which can produce distortions that result in misalignment of vias and conductors after firing. While shrinkage effects can be addressed to some extent during design for substrates having a modest interconnect density, the design process is made more time consuming and a significant reduction in yield may occur in applications with higher densities and tighter dimensional tolerances.

SUMMARY OF THE DISCLOSURE

Therefore, embodiments of the invention may be employed to address some or all of the limitations of conventional processes described above, to provide multiple layer electronic devices (such as electronic circuit substrates, portions of electronic circuits or circuit elements), where processes of forming such devices are compatible with a large variety of layer materials and layer thicknesses. Improved processing techniques that employ electroplated sacrificial structures to pattern one or more layers of a multiple layer device, as described herein, may be employed with a many different materials and layer thicknesses. As a result, aspects of the invention can provide a greater number of design options for layer materials, layer thicknesses and layer patterns designed to meet desired electrical, structure and environmental compatability properties.

In accordance with embodiments of the invention, a multilayer circuit substrate is comprised of a base substrate and one or more additional dielectric and conductive thin films formed over the base substrate. One or more of the dielectric film layers is fomed in a pattern having openings that allow interconnections between conductive layers or between a conductive layer and the base substrate located on opposite sides of the dielectric film layer.

Deposited dielectrics are patterned through the use of sacrificial structures that may be removed using highly selective etch chemistry. The sacrificial structures are formed using electroplating techniques. Electroplating techniques may be used to provide precise patterns and sacrificial structure configurations that could not be formed (or would be impractical to form) using shadow mask deposition techniques. In addition, electroplating techniques can allow dielectric patterns to be precisely registered to underlying structures and thus enabling high interconnect densities and narrow dimensional tolerances not achievable by conventional lamination techniques.

In accordance with further embodiments of the invention, patterning techniques such as electroplating, shadow masking, chemical etch and photoresist lift-off may be used for patterning conductive materials in the multilayer device. Conductors may therefore be precisely aligned with underlying structures and formed with linewidths not achievable by conventional lamination techniques.

In accordance with further embodiments of the invention, hermetic vias may be formed in the dielectric base substrate, for example, by forming successive thin layers of a conductive material on the sidewalls of a via hole using a dilute conductive ink, followed by formation of a conductive plug using a concentrated conductive ink and sintering of the conductive material, as described in U.S. patent application Ser. No. 10/671,996, filed 26 Sep. 2003, which is incorporated herein by reference.

Example embodiments of the invention employ vacuum deposition methods for depositing dielectric materials. Vacuum deposited dielectric layers may be formed significantly thinner than the dielectric layers used in conventional lamination techniques, allowing for the formation of multilayer circuit devices that have overall thicknesses significantly thinner than those formed by conventional lamination techniques. Because vacuum deposited dielectrics are deposited in an "as-fired" state that undergoes essentially no shrinkage during subsequent processing, yield reduction due to misalignment may be significantly reduced or eliminated. In addition, vacuum deposition techniques do not impose limitations on the types of conductors or dielectric materials that may be employed, enabling the use of a wide variety of materials with highly tunable properties. Vacuum deposition techniques also produce hermetic layers that facilitate the production of highly reliable substrates.

In accordance with example embodiments of the invention, a multilayer circuit device is characterized by a dielectric base substrate having conductors formed thereon, and at least one layer of a patterned vacuum deposited thin film dielectric overlying the conductors. One or more of the deposited thin film dielectrics have a pattern formed by using electroplated sacrificial structures. In various implementations, multiple layers of conductors and deposited dielectrics may be used, multiple layers may be formed on one or both sides of the base substrate, and the base substrate may include hermetic vias.

Also in accordance with example embodiments of the invention, a multilayer circuit device is produced according to a process in which a dielectric base substrate is provided. Conductors are then formed on the base substrate, preferably by patterning of a blanket layer of conductive thin film deposited by a vacuum deposition method. Sacrificial structures are then formed by electroplating sacrificial material on the base substrate and conductors. The sacrificial structures define areas of the base substrate and conductors that are to be protected during subsequent dielectric deposition. A thin film dielectric layer is vacuum deposited on the base substrate, the conductors and the sacrificial structures, and the sacrificial structures are removed to leave a patterned deposited thin film dielectric layer on the conductors and the base substrate. Further processing such as forming additional conductor layers and dielectric layers or mounting of an electronic component to the substrate may be performed.

DETAILED DESCRIPTION OF PREFERRED EMBODIMENTS

Figure 1A:
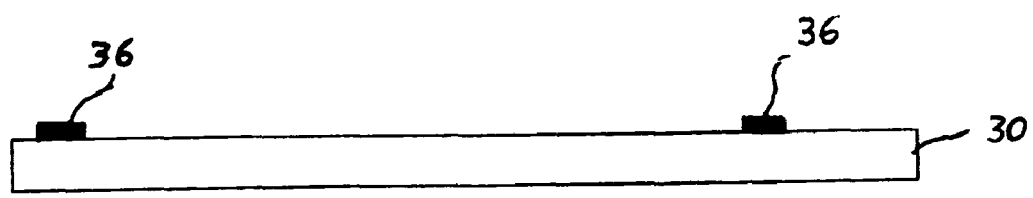
FIGS. 1a, 1b, 1c, 1d, 1e and 1f show structures formed during fabrication of a general multilayer circuit device in accordance with an embodiment of the invention.

Embodiments of the invention relate to multilayer electronic devices and methods for fabrication of multi-layer electronic devices. Particular embodiments of the invention relate to highly stable multilayer electronic devices and methods of fabrication thereof, for use in caustic or sensitive environments, such as medical and implant environments. In such embodiments, the material used for a patterned dielectric or other patterned materials in the multilayer electronic device are selected, in part, for suitable environmental compatability.

However, as described above, materials that are selected based on environmental compatability may not be the materials best suited for being formed into the precise patterns that may be required for an electronic circuit design, using traditional manufacturing processes. Accordingly, embodiments of the present invention employ improved techniques for forming sacrifical structures that are removed during fabrication, to leave a pattern (the reverse pattern of the sacrifical structure pattern) of a dielectric material in the layered structure. Processes using sacrifical structures formed by shadow masking techniques are described in U.S. patent application Ser. No. 10/671,996, filed 26 Sep. 2003, which has been incorporated herein by reference. However, shadow masking techniques can be impractical for forming certain pattern shapes or precision details in patterned layers. Also, shadow masking techniques can be impractical for forming patterns in large spanses, such as for large devices or for forming multiple devices simultaneously.

Accordingly, embodiments of the present invention relate to multilayer electronic devices and processes for making such multilayer devices in which electroplated sacrifical structures are used during fabrication to pattern certain dielectric or other material in one or more layers. Electroplating techniques used in embodiments of the invention are capable of providing sacrifical structures to form layer patterns that are more precise or in configurations not possible or practical with shadow mask deposition techniques. Furthermore, electroplating techniques used in embodiments of the invention are capable of efficiently and economically forming such sacrifical structures in relatively large spanses, such as for making relatively large electronic devices or for making a relatively large arrangement of multiple electronic devices, such as a wafer that is cut, after formation, into multiple electronic devices.

As described in further detail below, a dielectric material (or other material) in the multilayer device may be formed in a pattern by depositing a layer of the dielectric material (or other material) over sacrifical structures that have been electroplated in a selected pattern on an underlying layer. The dielectric material (or other material) may be deposited over the electroplated pattern of sacrifical structures, using a vacume deposition process. Thereafter, some or all of the sacrifical structures may be removed, for example, with an etching process that attacks the sacrifical structures from exposed or lightly covered side edges of the sacrifical structures, but does not remove the dielectric material (or other deposited material), leaving a selected pattern of the dielectric material (or other deposited material).

A variety of different dielectric materials (or other materials) may be formed in selected patterns in a multilayer electronic device in accordance with such processes as described below, including materials that have been difficult or impractical to form in precise patterns using traditional processes. Accordingly, embodiments of the invention can provide an electronic device designer with a greater variety of options for selecting materials to use in the patterned portions of a multilayer electronic device. In contexts in which the electronic device is to be operated or otherwise located in a caustic or sensitive environment, embodiments of the present invention may provide the designer with a greater variety of options of materials that are suitably compatable or inert with respect to the environment may be employed.

Therefore, particular embodiments of the invention relate to highly stable multilayer electronic devices and methods of fabrication thereof, for use in caustic or sensitive environments, such as medical and implant environments. In such embodiments, the material used for a patterned dielectric or other patterned materials in the device are selected, in part, for suitable environmental compatibility. Environmental compatibility may involve one or more of the ability for the material to provide its intended function over an intended operational life while disposed within the intended operational environment, the ability of the material to avoid contaminating or otherwise harming its operational environment during its intended operational life, or the like.

Example embodiments of a method for producing a multilayer circuit are described below, in the context of production of medical devices and, in particular a hermetic blood glucose sensor circuit designed to be implanted into a patient's body. Other embodiments may be employed in the context of production of other types of electronic circuits or electronic components (collectively refered to as electronic devices) used in medical devices and, in particular, to electronic devices designed to be implanted in a biological entity and, thus, subjected to an implant environment. Yet other embodiments may be employed for electronic devices designed for non-biological or non-medical applications that are subject to other forms of caustic or sensitive environmental conditions. Examples of alternative applications are provided below.

Figure 3:
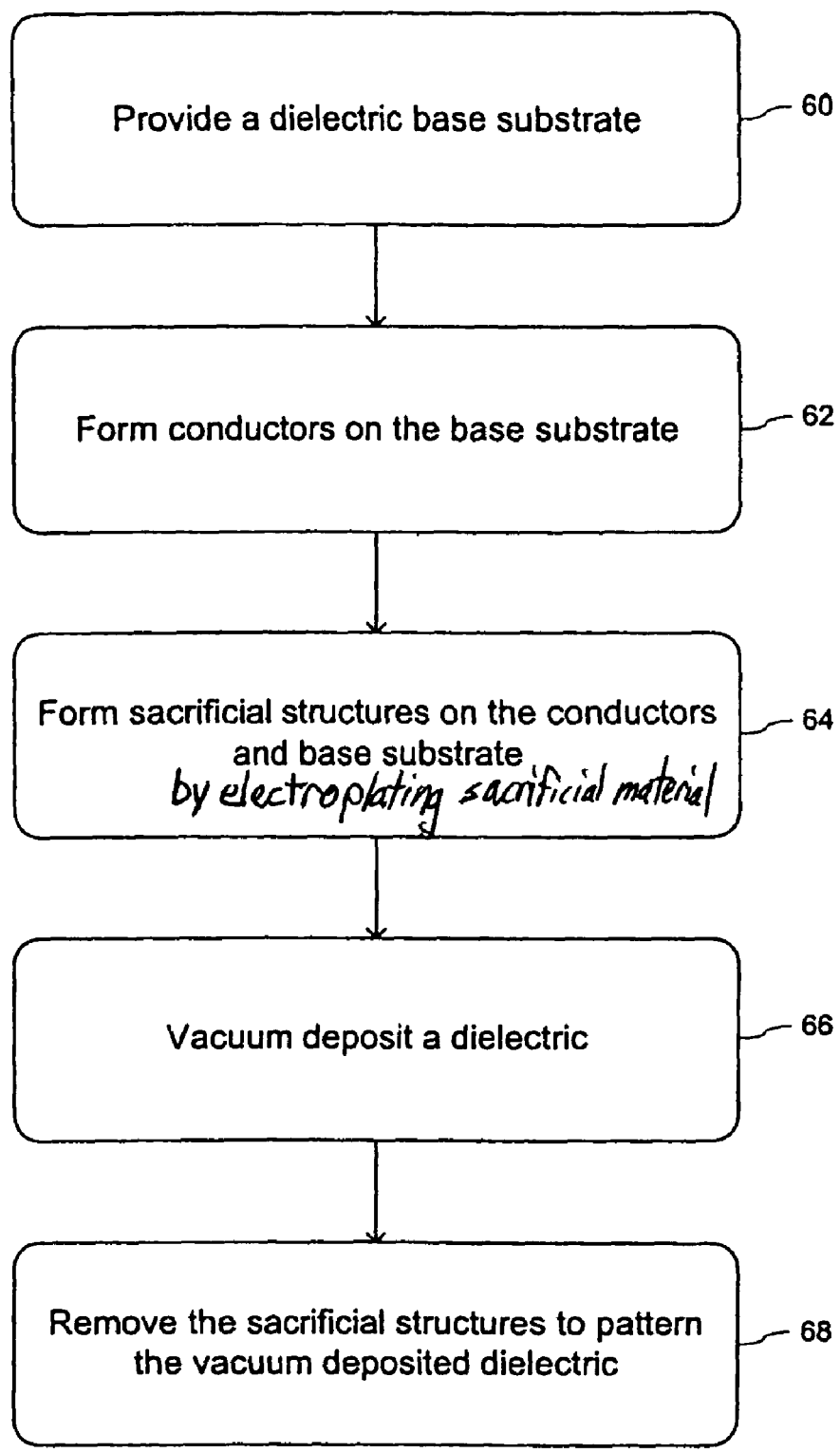
FIG. 3 shows a process flow according to an embodiment of the invention.
Figure 4:
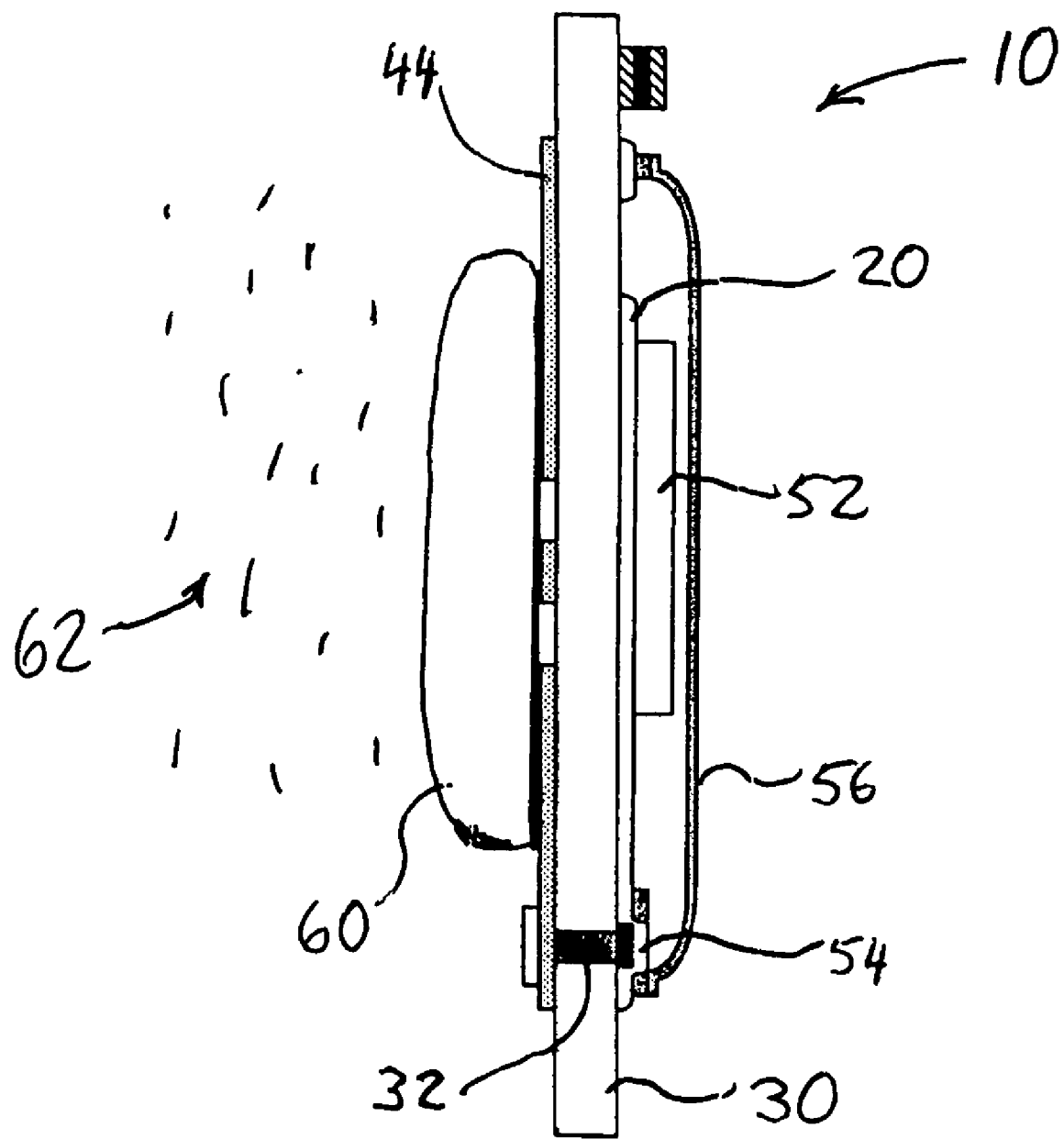
FIG. 4 shows an example of a medical sensor device made in accordance with the structures of FIGS. 2a-2k.

Because aspects of embodiments of the invention may be employed for a variety of different types of electronic devices and components, a generalized description of aspects of the invention is provided with respect to FIGS. 1a-1f, which shows the formation of a portion of a multilayer electronic circuit device. The example multilayer electronic circuit device formed according to FIGS. 1a-1f may be configured for any suitable context of use, including, but not limited to the medical device context for which a similarly labeled device is shown in FIGS. 2a-2k and 4. In particular, FIGS. 2a-2k show an example of a multilayer electronic circuit configured as part of a medical device, such as an implantable blood glucose level sensor. A generalized flow chart of a process of forming a multilayer circuit or circuit component as described herein is shown in FIG. 3. FIG. 4 shows an example of a medical device having a multilayer circuit as formed in accordance with FIGS. 2a-2k.

According to embodiments of the invention described herein, an electronic circuit or circuit component is formed with multiple layers of selected materials that are deposited (as described below) on a suitable support structure, such as a base substrate. FIGS. 1a through 1f show side views of structures formed during processing in accordance with an example embodiment of a process for producing a multilayer circuit for any suitable application of use. FIG. 1a shows a base substrate 30 having one or two major surfaces (the surfaces facing upward and downward in the drawing).

More specifically, FIG. 1a shows the substrate 30, after formation of patterned conductors 36 on the upward-facing major surface of the base substrate 30. In one example embodiment, the conductors 36 are formed of consecutive layers of titanium, platinum and titanium that are patterned by a photoresist lift-off process. In the lift-off process, a photoresist layer is patterned to form a negative image of the conductors 36 using a conventional exposure and developing technique. A blanket metal thin film is formed over the substrate and the photoresist pattern such as by physical vapor deposition (sputtering), and a photoresist stripping chemistry is then used to remove the photoresist pattern. Metal deposited on the photoresist is lifted off as the underlying photoresist is dissolved, while metal deposited on the base substrate adheres to the base substrate and remains after lift-off. Accordingly, precise lithographically patterned thin film conductors may be formed with precise alignment to the base substrate 30 and any vias that may be formed in the substrate. In other embodiments, the patterned conductors 36 are formed by other suitable processes for forming patterned conductive material on a substrate.

Figure 1B:
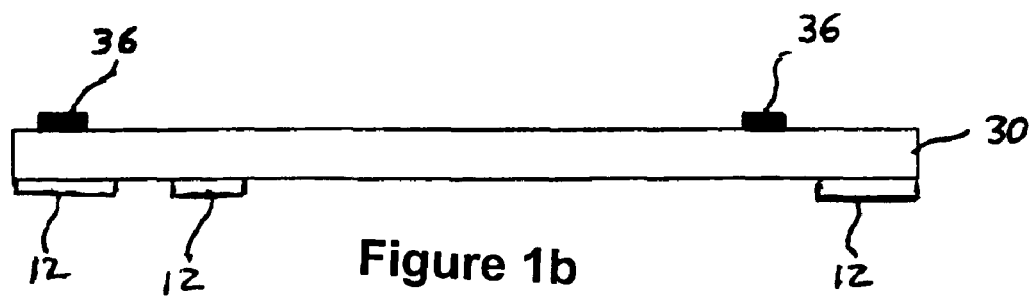

FIG. 1b shows the structure of FIG. 1a after formation of a seed layer 12 for electroplating on or sufficiently near the opposite surface of the substrate from the surface on which electroplated material is to be deposited. The seed layer comprises electrically conductive material disposed in a selected pattern. The seed layer may be formed by a photolithography process or other suitable process for applying a conductive material to the substrate. Photolithography may be a preferred manner of applying a seed layer, in contexts in which a fine or precise pattern is desired. Photolithographic processes can produce finer, more intricate patterns than may be practical with conventional masking techniques.

Figure 1C:
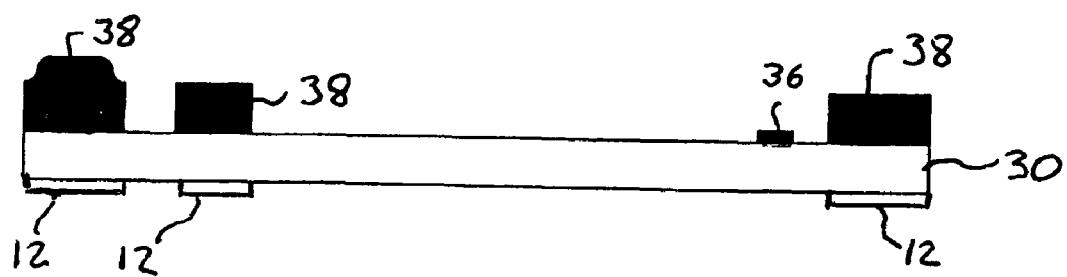

FIG. 1c shows the structure of FIG. 1b after formation of sacrificial structures 38 on the base substrate 30 and the conductors 36. The sacrificial structures 38 are used to define areas of the base substrate 30 and conductors 36 that are to be protected during subsequent deposition of a dielectric material. The sacrificial structures 38 are preferably formed of a material that will survive subsequent vacuum deposition of dielectric and that is easily removed in later processing by an etchant that is selective of the sacrificial material with respect to other exposed materials.

The sacrificial structures 38 may be formed of gold that is applied in a desired pattern using an electroplating process, where the seed layer (bearing a positive image of the desired pattern) controls the location at which the sacrificial structures are formed. Gold is electroplated in a pattern corresponding to the pattern on the seed layer. In other embodiments, other suitable sacrificial materials may be employed, as described below. In particular, a suitable sacrificial material may be a material that is capable of being applied by electroplating processes, is compatable with the substrate 30, conductors 36 and the selected overlying dielectric material (described below), yet is readily soluable or otherwise removeable with an etchant or other suitable agent that will not effectively remove the dielectric material selected of the overlying dielectric layer (described below).

Figure 1D:
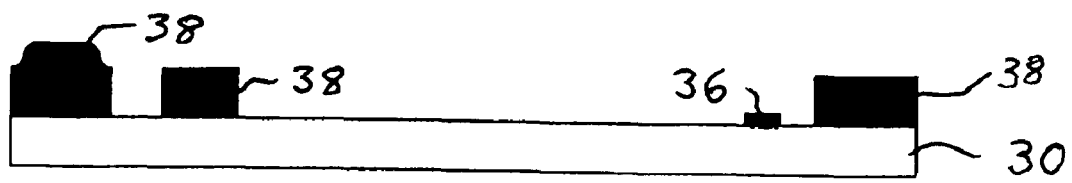

FIG. 1d shows the structure of FIG. 1c, after the electroplating seed layer is removed, leaving patterned gold sacrifical structures 38. It is preferable to form the sacrificial structures 38 to be substantially thicker than the subsequent dielectric layer that is to be patterned using the sacrificial structures 38.

Figure 1E:
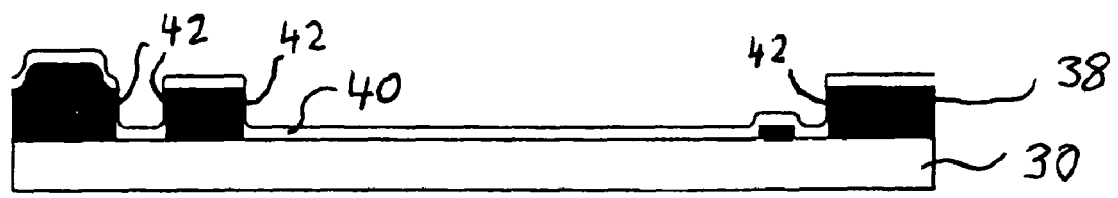

FIG. 1e shows the structure of FIG. 1d after forming a dielectric thin film 40 over the base substrate, the conductors and the sacrificial structures. In an example embodiment the dielectric material is alumina and is vacuum deposited by a method such as sputtering or evaporation, producing a highly hermetic dielectric material in an "as fired" form, that is, in a form that will not undergo significant structural changes such as shrinkage during subsequent processing. To enhance the density, adhesion and hermeticity of the dielectric thin film 40, ion beam assisted deposition (IBAD) may be employed, wherein the deposited dielectric material is bombarded with low energy ions during deposition to provide improved adhesion and coating density. Formation of dielectric thin films by vacuum deposition can produce layers having thicknesses in the range of 100 angstroms to 20 microns (0.00004-0.0008 inches), compared to the conventional minimum green sheet thickness of 0.006 inches or approximately 150 microns. Accordingly, the use of vacuum deposited dielectric thin films rather than conventional sheet dielectrics allows the production of significantly thinner multilayer substrates or the production of multilayer substrates having significantly more layers than those formed by conventional lamination methods. In addition, vacuum deposited layers are highly hermetic and provide significant protection of underlying materials against the outside environment.

Figure 1F:
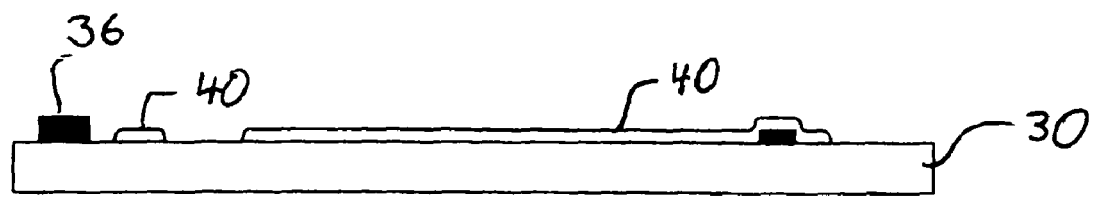

FIG. 1f shows the structure of FIG. 1e after patterning of the deposited dielectric layer 40 by selective removal of the gold sacrificial structures. The gold sacrificial structures may be removed selectively with respect to the titanium conductors, and alumina base substrate, using a ferric chloride solution or another mild etchant that is selective with respect to the gold sacrificial structures.

The etchant reaches the gold sacrificial structures through pin-holes and other imperfections in the extremely thin layers of dielectric material that are deposited on the sidewalls 42 of the sacrificial structures 38. By forming the sacrificial structures 38 to be substantially thicker (taller in the drawings) than the dielectric layer 40, it is ensured that there will be sufficiently thin sidewall coverage and sufficient sidewall surface area to enhance penetration of the etchant. As the gold sacrificial structures 38 dissolve, the portion of the dielectric thin film 40 overlying the sacrificial structures 38 collapses and is rinsed away in subsequent cleaning, leaving a patterned dielectric thin film as shown in FIG. 1f that protects selected portions of the conductors 36 and base substrate 30 surface area while also selectively exposing portions of the conductors 36 for connection to overlying conductors.

The sacrificial structures 38 may be precisely positioned relative to the base substrate 30 and conductors 36 using the electroplating process described above. In addition, because the deposited dielectric thin film 40 will not undergo significant structural changes during further processing, the openings in the deposited dielectric thin film 40 may be precisely aligned with the underlying conductors 36 and base substrate 30. Accordingly, the dielectric film 40 may be formed with a relatively high level of pattern precision and in relatively intricate pattern configurations.

Depending upon the type of circuit or circuit component being formed, one or more additional layers of conductive material, electroplated sacrificial structures and/or dielectric material may be formed over the structure shown in FIG. 1f. In this regard, further embodiments of the present invention may involve a layered electrical circuit or circuit component that has more than one dielectric layer, each of which are patterned using electroplated sacrificial structures, as described above. Also, depending upon the type of circuit or circuit component being formed, layers of material may be formed on both major surfaces of the substrate 30, according to processing as described above.

Embodiments of the invention may be employed to produce a wide variety of different types of electronic circuits and circuit elements. As an example for assisting in the description of aspects of the invention, processes are described below for forming a multilayer circuit and a medical device that includes a multilayer circuit, such as a blood glucose sensor device 10 as shown in FIG. 4. However, it will be understood that aspects of the invention may be employed for multilayer circuits or circuit elements for other medical or non-medical devices.

The sensor device 10 of FIG. 4 includes multiple layers 20 of dielectric, conductive and insulative materials formed on at least one side of a base substrate 30 to form an electronic circuit and/or circuit elements. One or more of the multiple layers 20 are formed in patterns, by processes that use electroplated sacrificial structures, as described below. Depending upon the type of device formed with the inventive processes, the multiple layers 20 may be part of an overall electronic circuit, a complete electronic circuit or one or more electronic components. Also depending upon the type of device formed by the inventive process, the electronic circuit or circuit elements formed by the layers 20 may be electrically coupled to one or more further electronic components, represented by the medical device embodiment of FIG. 4 as an integrated circuit 52 and a discrete capacitor 54. In further embodiments, circuit compoents (such as the discrete capacitor 54) may be formed in accordance with the multilayer processing techniques described herein.

Processes for forming a multiple layer electrical circuit 20 using electroplated sacrifical structures according to embodiments of the invention described herein may be employed with a variety of different types of dielectric or other materials in the layered circuit 20. Such processes are capable of forming many different types of dielectric or other materials in patterns with precision and configurations that were not practical with shadow masking deposition techniques.

In some embodiments, the base substrate 30 may provide an hermetic seal between two opposite sides of the base substrate, such as in contexts in which a sensitive circuit or circuit element formed with the layers 20 and/or components 52 and 54 on one side of the base substrate 30 is to be protected from environmental conditions on the other side of the substrate. For example, as shown in FIG. 4, a reactive sensor element 60, such as a sensor enzyme, may be located on one side of the base substrate 20 and may be exposed to biological media 62 present in a medical or implant environment. Examples of various sensor configurations that include enzymes for use in medical sensor circuit devices are described in U.S. Pat. Nos. 6,477,395, 6,498,043, 6,512,939 and 6,809,507, each of which is incorporated herein by reference.

An electronic circuit may be formed with layers 20 on the other side of the base substrate and protected from the medical or implant environment, at least in part, by the hermetic base substrate. A cap 56 over the layers 20 and components 52 and 54 may provide a further portion of the hermetic seal. Hermetically sealed conductive vias 32 may be provided through the base substrate to connect conductors 44 on the enzyme side of the base substrate with circuit elements formed in the layers on the other side of the base substrate. An example process for forming hermetic vias in a base substrate is described in U.S. patent application Ser. No. 10/671,996, filed 26 Sep. 2003, which has been incorporated herein by reference. However, other embodiments may employ other suitable processes for providing hermetic vias in the base substrate 30. Yet other embodiments may employ a base substrate and vias that need not provide an hermetic seal, wherein the vias may be formed in any suitable via forming process.

FIGS. 2a through 2k show structures formed during processing in accordance with an example embodiment of a process, as generally described above, but for producing a blood glucose sensor using a base substrate having vias formed therein. Each of FIGS. 2a through 2k provides a top plan view, a cross-section taken along line A-A' of the top plan view, and a bottom plan view of a section of a substrate upon which processing is performed in accordance with the preferred embodiment.

Figure 2A:
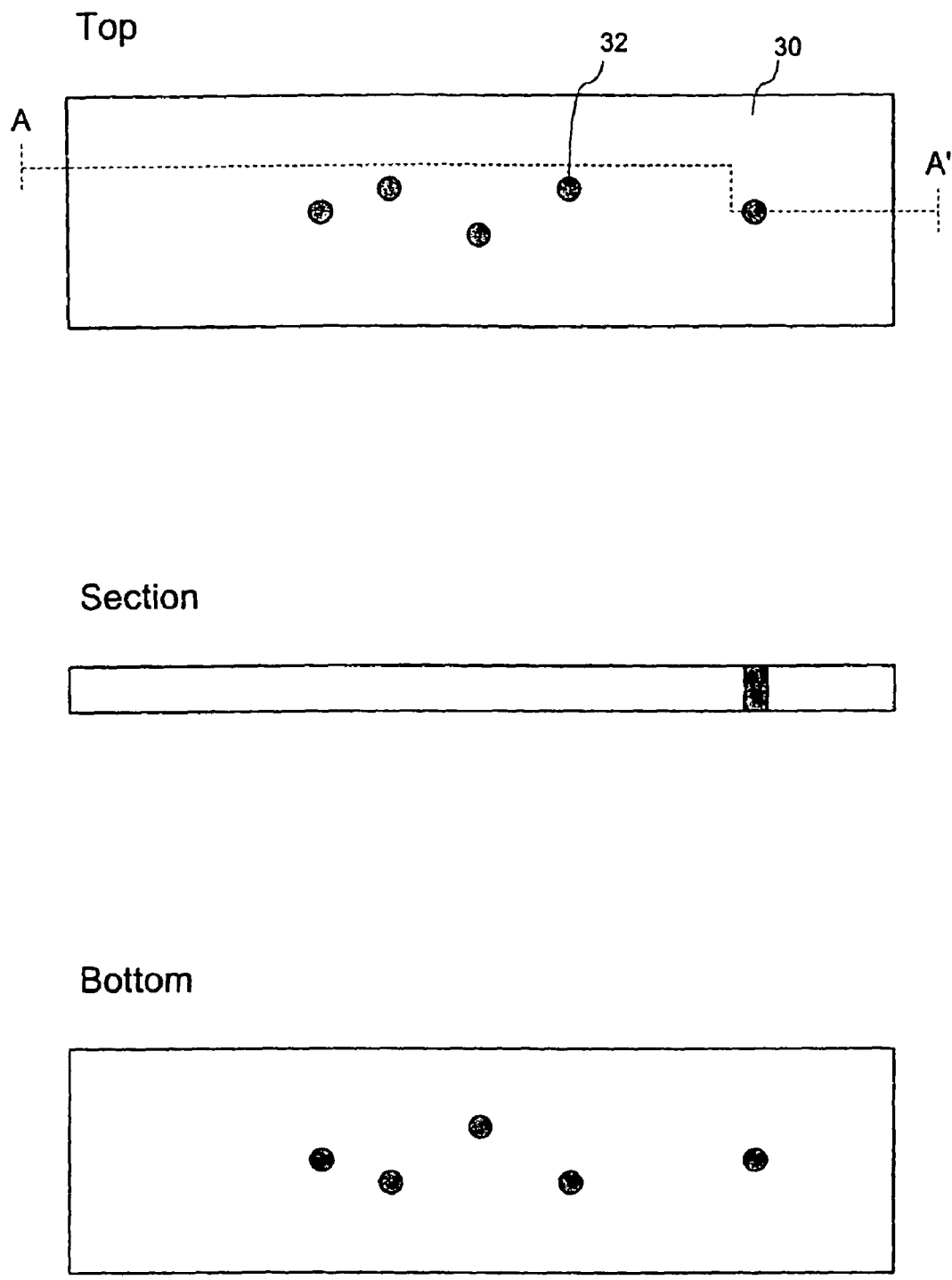
FIGS. 2a, 2b, 2c, 2d, 2e, 2f, 2g, 2h, 2i, 2j and 2k show structures formed during fabrication of a medical sensor device having a multilayer circuit in accordance with an embodiment of the invention.

FIG. 2a shows a base substrate 30 having a plurality of hermetic vias 32 extending between its major surfaces, as described above. FIGS. 2b-2k show the formation of multiple layers (represented by the layers 20 in FIG. 1) on the base substrate 30.

Figure 2B:
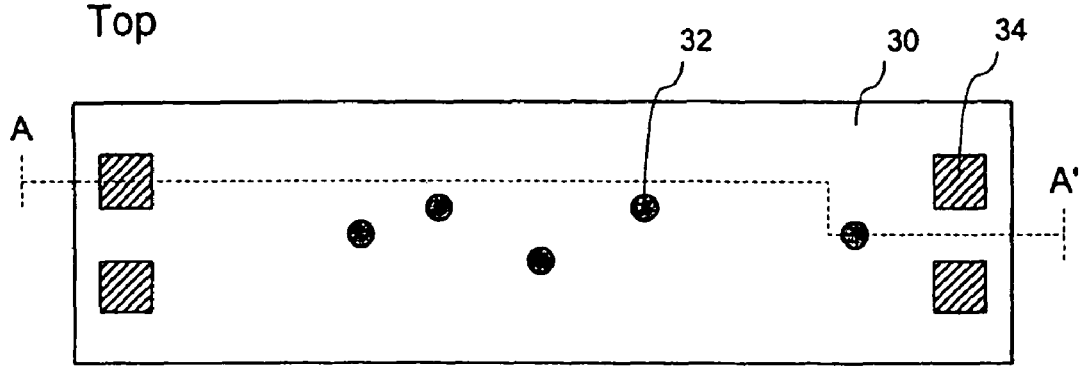
Figure 2B:
Figure 2B:
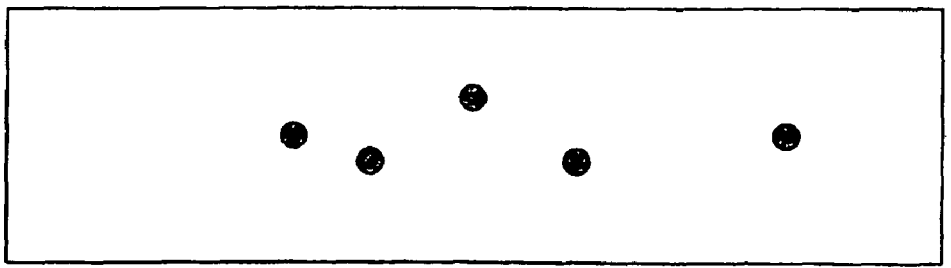

FIG. 2b shows the structure of FIG. 2a after formation of conductive welding pads 34 on the top surface of the substrate 30. The welding pads 34 provide connection points for external wires to the circuitry that will be mounted on the substrate.

The welding pads of the preferred embodiment are formed by screen printing using a platinum conductive ink, however in alternative embodiments contacts may be formed by other suitable techniques.

Figure 2C:
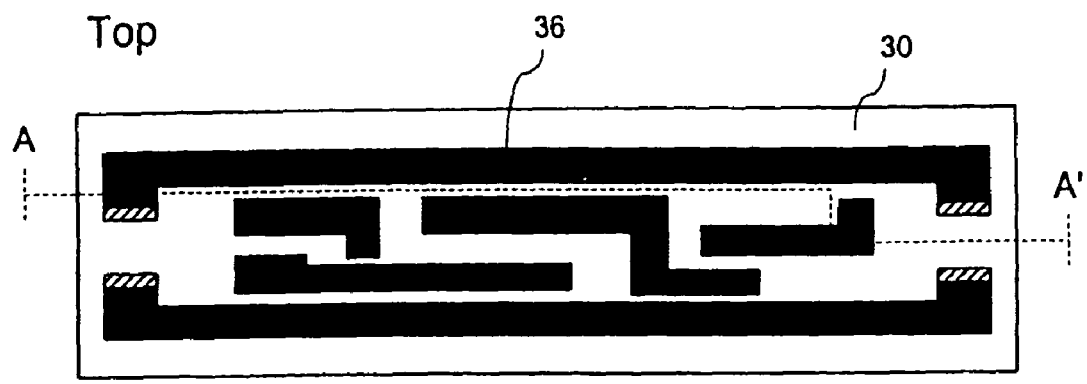
Figure 2C:
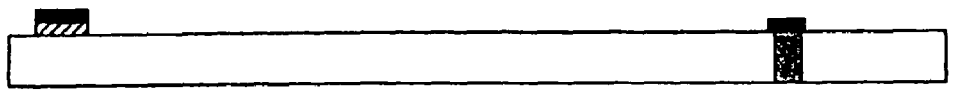
Figure 2C:
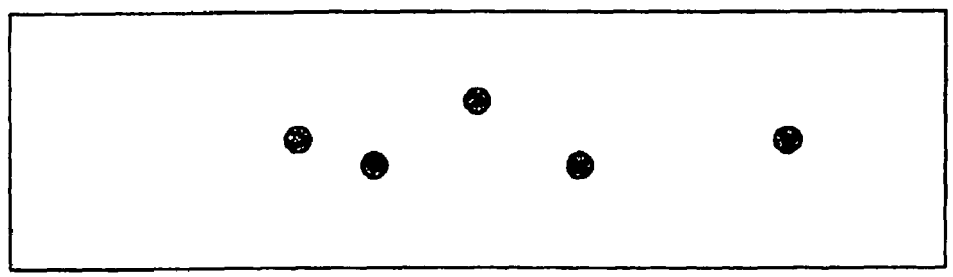

FIG. 2c shows the structure of FIG. 2b after formation of patterned conductors 36 on the top surface of the base substrate 30 and over at least a portion of the conductive pads 34. In one example embodiment, the conductors 36 are formed of consecutive layers of titanium, platinum and titanium that are patterned by a photoresist lift-off process, as described above with respect to FIG. 1a.

Figure 2D:
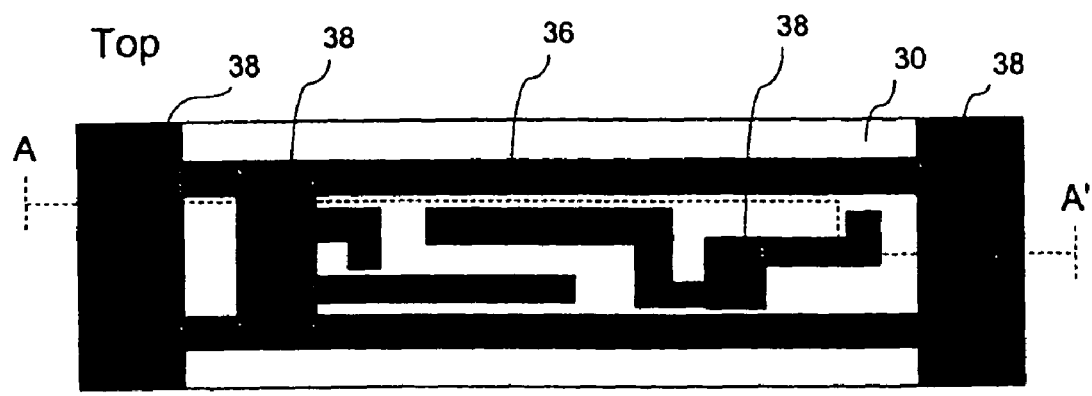
Figure 2D:
Figure 2D:
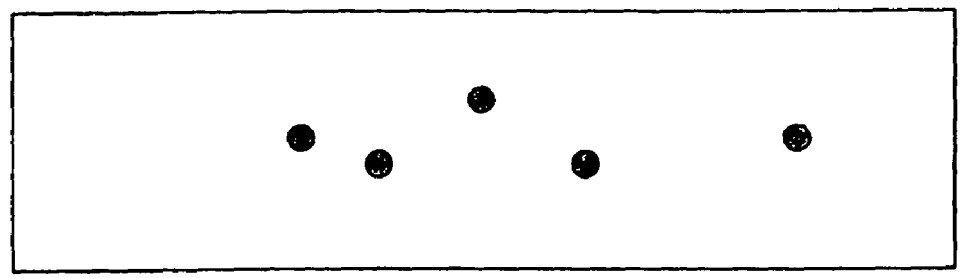

FIG. 2d shows the structure of FIG. 2c after formation of sacrificial structures 38 on the base substrate 30 and the conductors 36. The sacrificial structures 38 are used to define areas of the base substrate 30 and conductors 36 that are to be protected during subsequent deposition of a dielectric material. The sacrificial structures 38 are preferably formed of a material that will survive subsequent vacuum deposition of dielectric and that is easily removed in later processing by an etchant that is selective of the sacrificial material with respect to other exposed materials. In one example embodiment, the sacrificial structures 38 are gold that is formed in a desired pattern using an electroplating process as described above. The sacrificial structures 38 are formed to be substantially thicker than the subsequent dielectric layers that is to be patterned using the sacrificial structures 38.

Figure 2E:
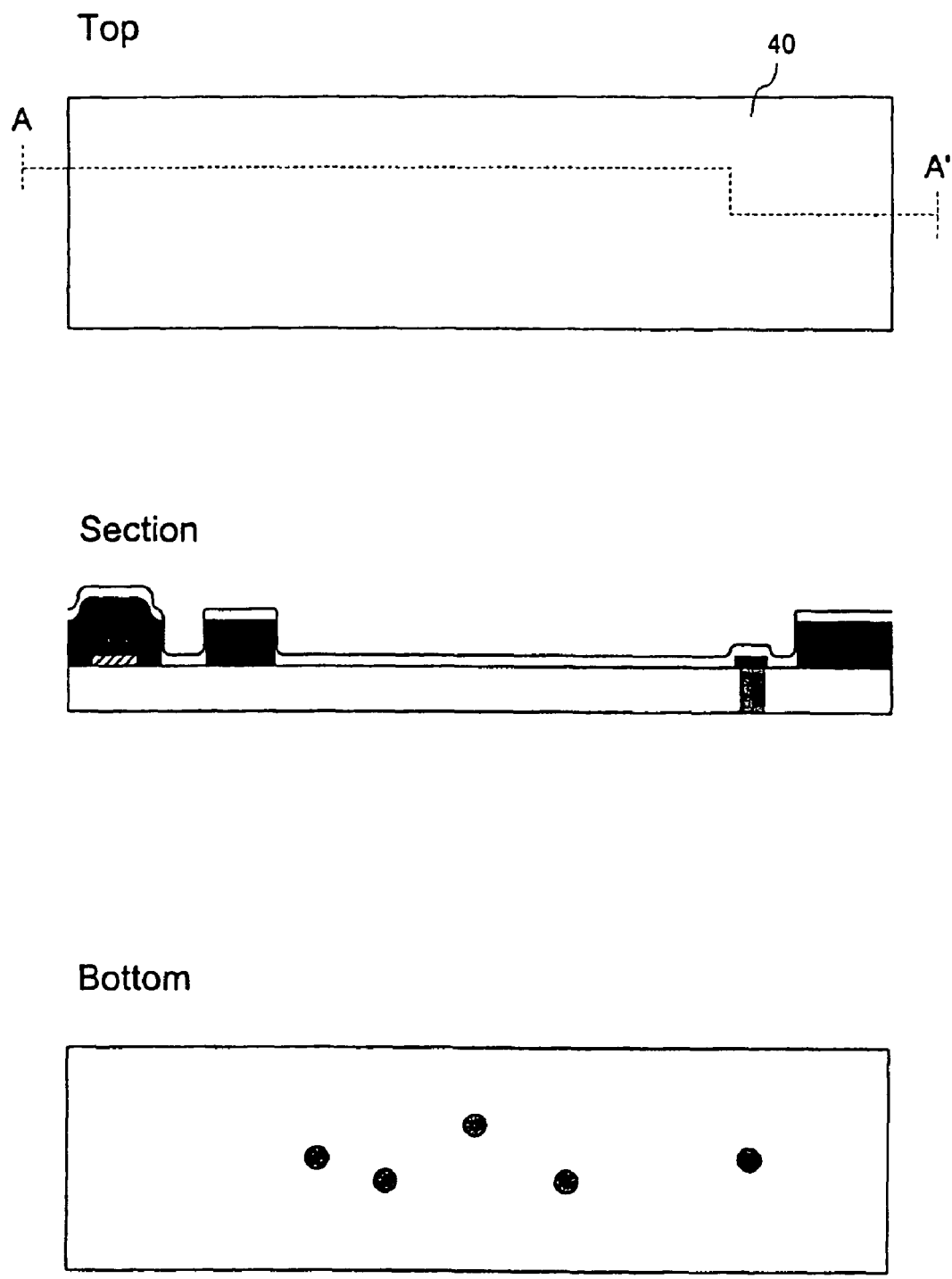

FIG. 2e shows the structure of FIG. 2d after vacuum deposition of a dielectric thin film 40 over the base substrate, the conductors and the sacrificial structures. In an example embodiment the dielectric material is alumina and is vacuum deposited by a method such as sputtering or evaporation, producing a highly hermetic dielectric material in an "as fired" form, as described above. To enhance the density, adhesion and hermeticity of the dielectric thin film 40, ion beam assisted deposition (IBAD) may be employed, also as described above.

Figure 2F:
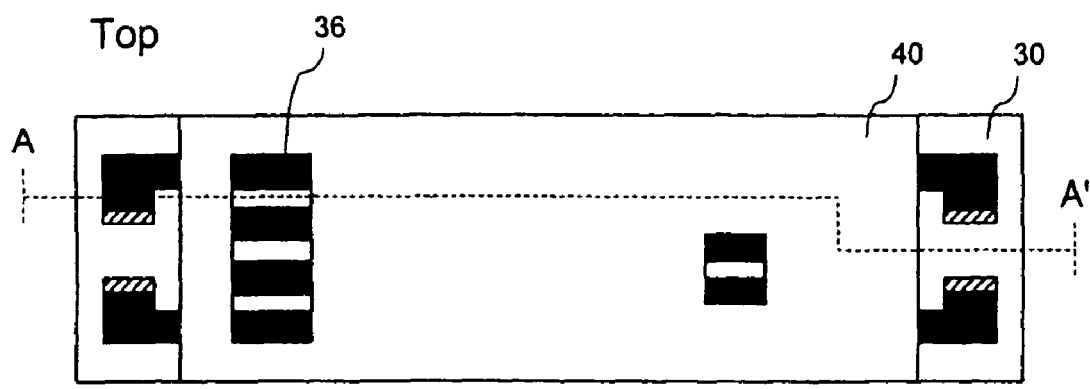
Figure 2F:
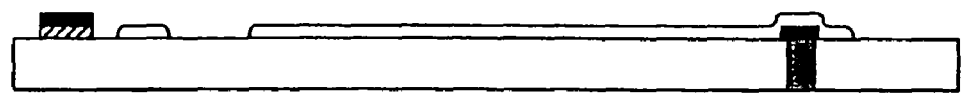
Figure 2F:
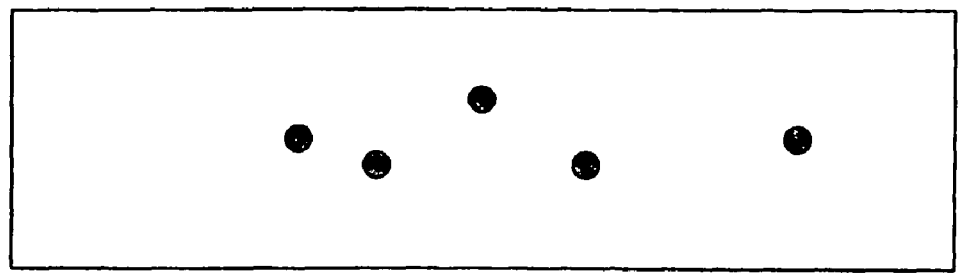

FIG. 2f shows the structure of FIG. 2e after patterning of the deposited dielectric layer 40 by selective removal of the gold sacrificial structures. The gold sacrificial structures may be removed selectively with respect to the titanium conductors, and alumina base substrate, using a ferric chloride solution or another mild etchant that is selective with respect to the gold sacrificial structures, as described above. Because the sacrificial structures 38 are precisely positioned relative to the base substrate 30 and conductors 36 using the electroplating process described above, and because the deposited dielectric thin film 40 will not undergo significant structural changes during further processing, the openings in the deposited dielectric thin film 40 are precisely aligned with the underlying conductors 36 and base substrate 30, enabling greater via and conductor densities and providing greater process yield.

Figure 2G:
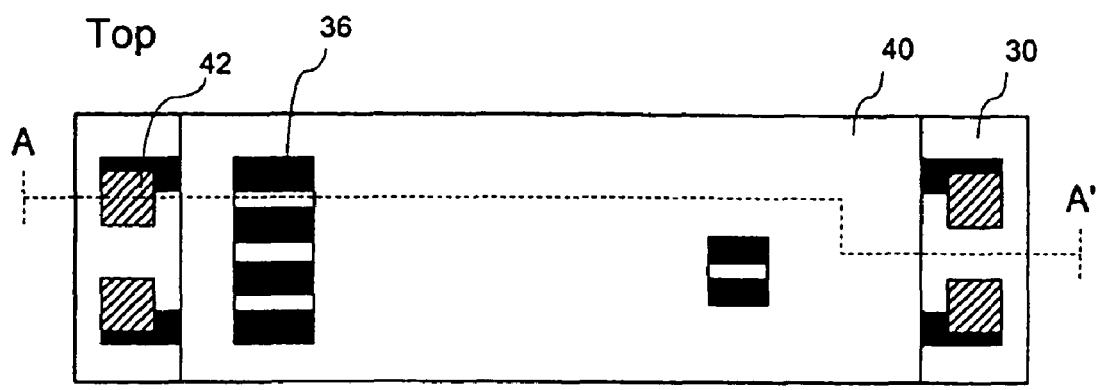
Figure 2G:
Figure 2G:
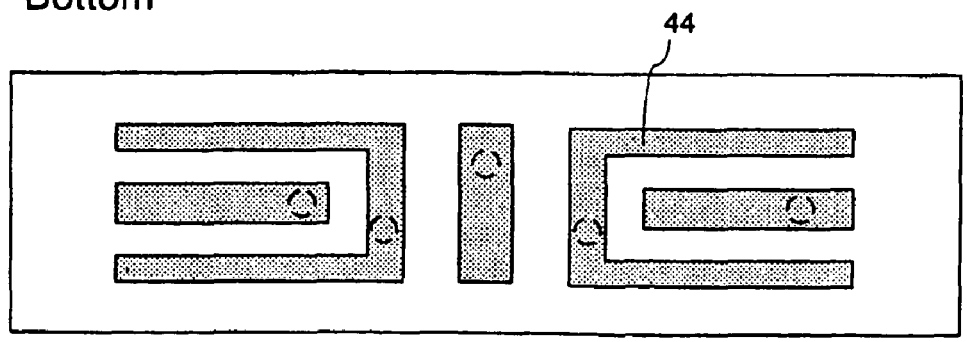

FIG. 2g shows the structure of FIG. 2f after formation of additional welding pads 42 on the top surface of the base substrate 30, followed by formation of sensor electrodes 44 on the bottom surface of the base substrate 30. The sensor electrodes 44 may be formed, for example, of successive thin films of titanium, platinum and titanium that are patterned on the bottom surface of the base substrate 30 by a photoresist lift-off process.

Figure 2H:
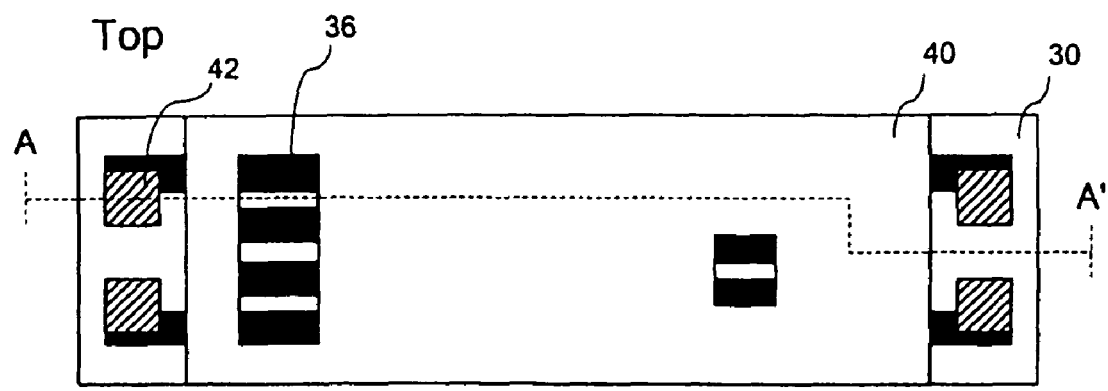
Figure 2H:
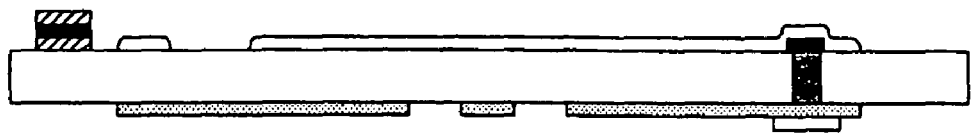
Figure 2H:
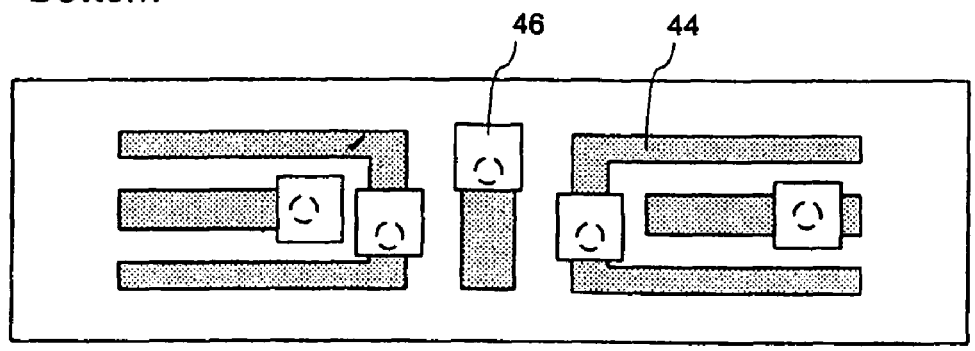

FIG. 2h shows the structure of FIG. 2g after formation of caps 46 over portions of the sensor electrodes 44 that are in contact with vias 32 that extend through the dielectric base substrate 30. The caps 46 prevent access of fluid contaminants to the vias 32 and portions of the base substrate 30 in the vicinities of the vias that may be somewhat amorphous as a result of laser drilling and therefore more susceptible to chemical degradation. In the preferred embodiment the caps 46 are highly pure alumina caps that are formed using a positive shadow mask process, thus allowing precise registration of the caps 46 to the vias 32.

Figure 2I:
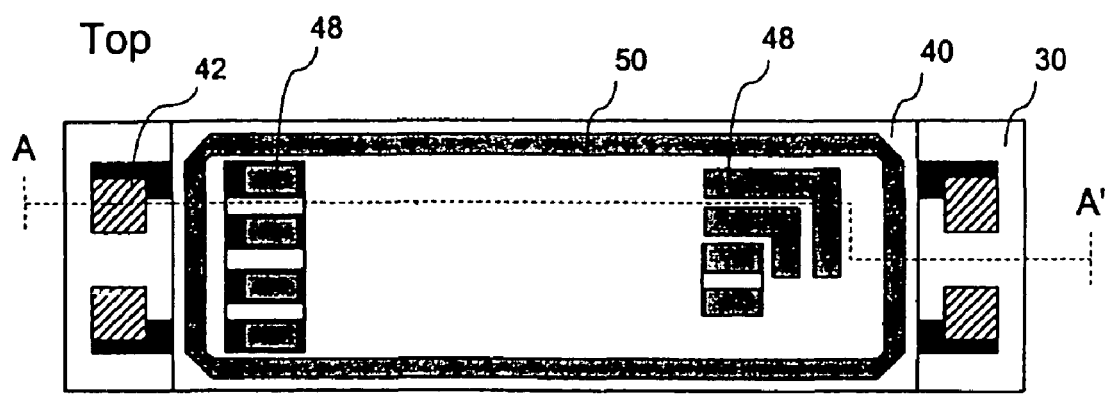
Figure 2I:
Figure 2I:
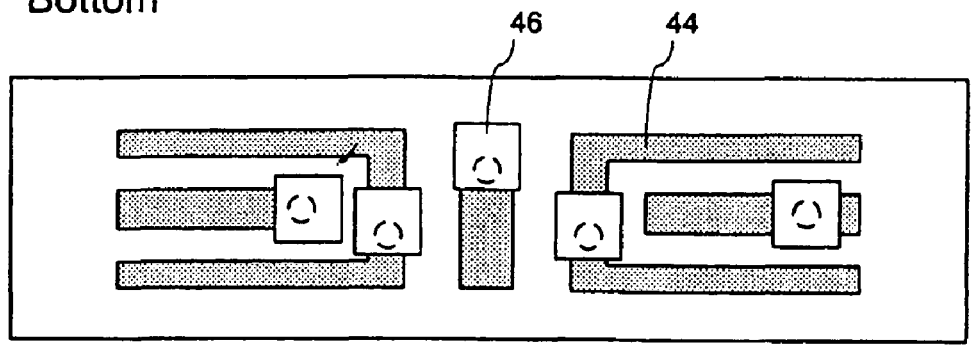

FIG. 2i shows the structure of FIG. 2h after formation of gold contact pads 48 on exposed portions of the conductors 36. The gold contact pads 48 provide contact points for electrical connection of integrated circuits and discrete devices to the conductors 36. A gold ring 50 is also formed at the perimeter of the deposited dielectric thin film 40 and defines an area within which circuit components will be mounted. The gold ring 50 is used in later processing for bonding a protective cap over the circuit components. The gold contact pads 48 and gold ring 50 may be formed, for example, by a photoresist lift-off process.

Figure 2J:
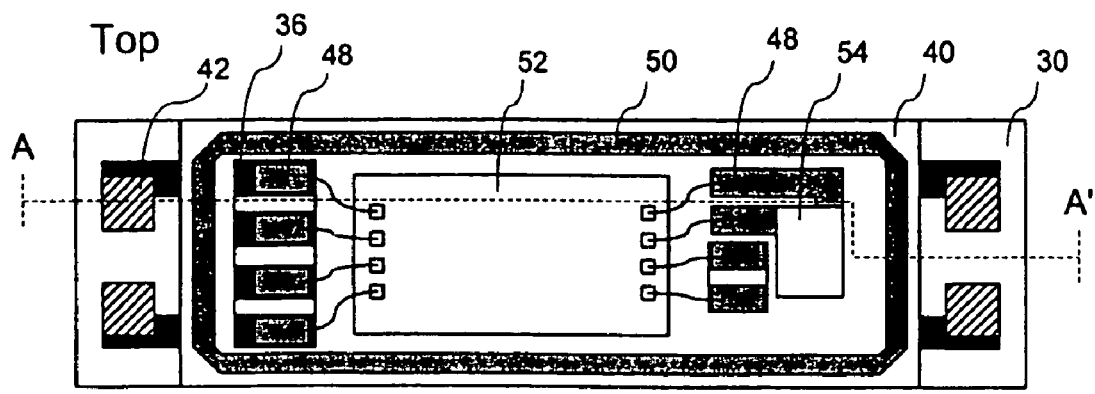
Figure 2J:
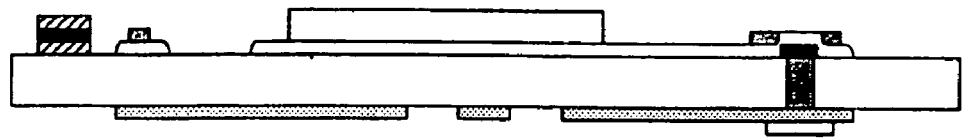
Figure 2J:
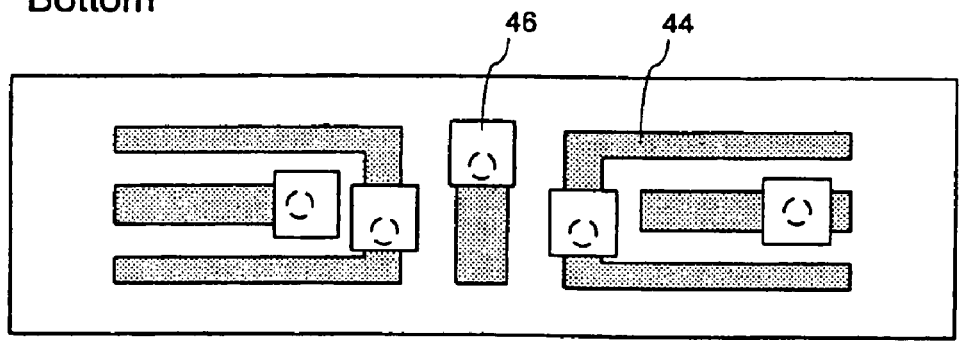

FIG. 2j shows the structure of FIG. 2i after mounting of an integrated circuit 52 and a discrete capacitor 54 to the multilayer substrate composed of the base substrate 30, the conductors 36 and the deposited dielectric thin film 40. The integrated circuit 52 is connected to the gold contact pads 48 by wire bonds. In the preferred embodiment, the integrated circuit is in electrical communication with the sensor electrodes 44 on the bottom of the base substrate 30 through the conductors 36 formed on the top surface of the base substrate 30 and the hermetic vias 32 formed through the base substrate 30. The integrated circuit 52 makes oxygen and glucosine measurements using readings taken from the sensor electrodes 44 and provides a digital output representing those measurements. While the preferred embodiment connects the integrated circuit 52 using wire bonds, in alternative other connection structures such as flip chip and ball grid array structures may be used.

Figure 2K:
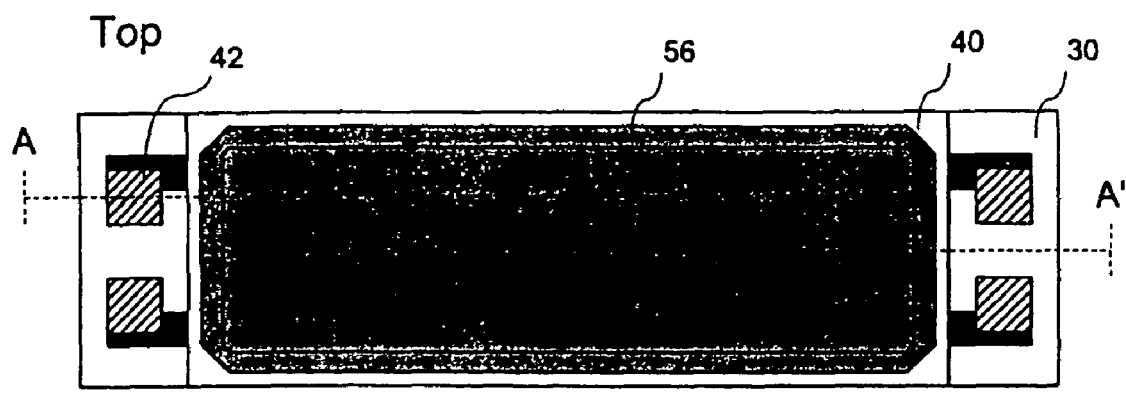
Figure 2K:
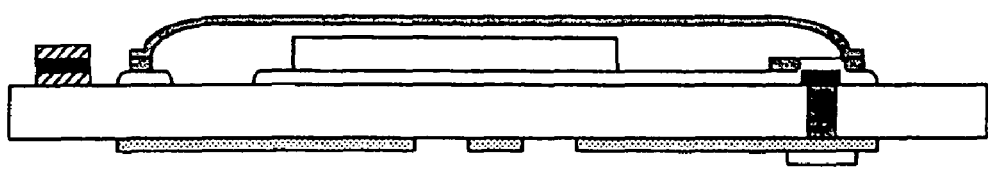
Figure 2K:
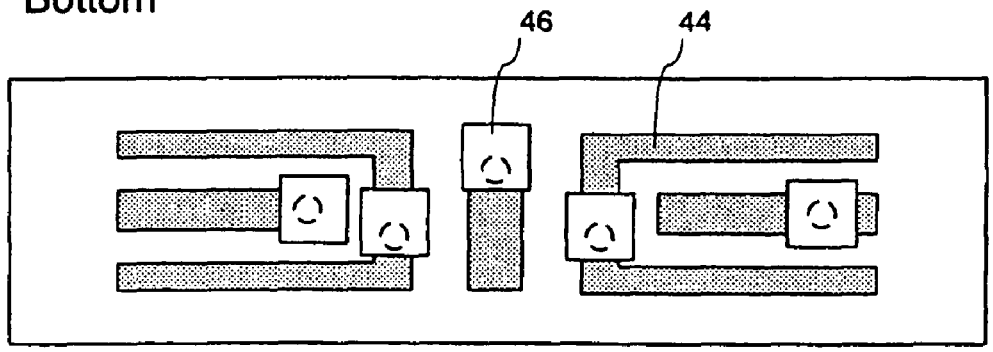

FIG. 2k shows the structure of FIG. 2j after bonding of a protective cap 56 to encase the circuit components. The cap 56 is preferably a gold cap that is bonded to the gold ring formed on the deposited dielectric thin film. In the resulting structure the protective cap 56 provides a hermetic seal against fluids at the top surface of the substrate, while the hermetic vias 32 and their associated caps 46 provide hermetic seals against fluids at the exposed bottom surface where the sensor electrodes 44 are located. The deposited dielectric thin film 40 that lies between the gold cap and the base substrate is also hermetically bonded to the base substrate 30 by virtue of its vacuum deposition, and as a result the circuit components are completely hermetically sealed against the outside environment.

While the processing shown in FIGS. 2a-2k represents a preferred embodiment for producing a blood glucose monitor, the techniques used in the disclosed processing are generally applicable to a wide range of applications in which it is desired to produce thin multilayer substrates. For example, techniques employing electroplated sacrificial structures may be employed in processes in which it is desirable to pattern a dielectric or other material, such as alumina, with a precision or in configurations that have, traditionally, been impractical with shadow masking techniques. Alternatively or in addition, such techniques may be used to produce thin multilayer substrates with a high degree of alignment precision, relatively little shrinkage, and/or a potentially high conductor and via density.

In general terms the techniques of the preferred embodiment may be adapted to form multilayer substrates comprised of any desired number of dielectric and conductors layers. The substrate is formed of patterned dielectric and conductive thin films that are deposited on a base substrate. Deposited dielectric layers are patterned using electroplated sacrificial structures to form openings in the dielectric layers for vias or for exposing larger contact areas of conductors.

The thin films used in accordance with embodiments of the invention are preferably vacuum deposited. For purposes of this disclosure, the term vacuum deposited refers deposition of a material at a low pressure in a controlled atmosphere. Such techniques include evaporation, sputtering (PVD) and chemical vapor deposition (CVD). Evaporation is preferably used where it is desired to form a relatively thick layer, e.g. 10 microns. However evaporation provides relatively poor adhesion and density. The adhesion and density of evaporated layers may be improved through the use of ion bombardment (ion-assisted evaporation). Sputtering (PVD) is preferred where adhesion is a priority. However the growth rate of layers formed by sputtering is approximately an order of magnitude slower than those formed by evaporation. CVD may be used as needed to form layers of materials that are not easily formed by evaporation or sputtering.

While embodiments described above employ a vacuum deposited alumina dielectric material and gold sacrificial structures that are etched using a ferric chloride solution, other embodiments may employ other suitable sacrifical materials, dielectric materials and etchants. The dielectric material (or other material to be patterned by the electroplated sacrificial structures) may be any suitable material that provides intended electrical and/or structural functions within the multi-layer electrical circuit or circuit component, and that is compatable with the selected sacrificial material, etchant and the underlying or overlying layers. By using electroplated sacrificial structures to pattern the dielectric (or other) material, many materials that were, heretofor, difficult or impractical to pattern using conventional processes may be employed.

Accordingly, embodiments of the invention also provide great freedom of choice with respect to the deposited dielectric material. In some embodiments, the dielectric layer should be capable of formation by a vacuum deposition technique that provides good adhesion to underlying materials and good process control for producing very thin layers. As a general matter any dielectric material that can be obtained in a substantially pure form may be evaporated and vacuum deposited as a thin film on a substrate. A variety of deposited dielectric materials may be used including alumina, aluminum nitride, silicon oxide, silicon nitride, silicon oxynitride, titanium nitride and the like. Vacuum deposited dielectric thin films provide a number of desirable properties, including highly controllable thickness, high hermeticity, dimensional stability, thermal and chemical stability, and tunable dielectric and thermal conductance properties. For purposes of this disclosure, the term "deposited dielectric" is therefore used not only to describe the processing by which the dielectric is formed, but also the resulting structural features of the deposited dielectric that distinguish it from conventional laminated dielectrics, including its conformality and hermeticity with respect to the materials on which it is formed, its high density and adhesion, and its dimensional, thermal and chemical stability.

As described above, a suitable sacrificial material may be any material that is capable of being applied by electroplating processes, is compatable with the substrate 30, conductors 36 and the selected overlying dielectric material (described below), yet is readily soluable or otherwise removeable with an etchant or other suitable agent that will not effectively remove the dielectric material selected of the overlying dielectric layer (described below). While gold is used as the sacrificial material in embodiments described above, other suitable sacrificial materials may include, but are not limited to, silver, copper, nickel, aluminum or combinations thereof, depending upon their electrical and/or structural characteristics and compatibility with other layers and the intended environment of use. Examples of various types of electroplatable sacrificial materials and corresponding compatible dielectic materials and etchant materials are shown in the respective rows of table 1, below. However, it will be understood that aspects of the invention may be employed with other suitable electroplatable sacrifical materials, dielectric materials and etchant materials, or other suitable combinations thereof.

With regard to the base substrate, a rigid sheet of an as-fired dielectric ceramic material may be used in accordance with some embodiments of the present invention. However, the base substrate may be composed of a wide variety of substrate materials since the deposition processes used to form forming dielectric and conductive thin films are performed at relatively low temperatures, and patterning of those thin films using sacrificial structures utilizes relatively mild etchants. While the preferred embodiment uses a substrate comprising 92-96% purity alumina, high purity berillia and aluminum nitride base substrates may also be used.

Other types of dielectric substrates such as flexible materials, including, but not limited to polyimide flex board, flexible substrate tape, or the like, or nonflexible materials, including but not limited to standard printed circuit board substrates comprised of epoxy resin with or without impregnated glass fiber may also be used. Further embodiments of flexible substrates and processes for forming multiple layer circuit devices therewith are described in U.S. patent application Ser. No. 09/779,282 filed Feb. 8, 2001, and U.S. patent application Ser. No. 09/502,204, filed Feb. 10, 2000, each of which is incorporated herein by reference.

Flexible substrates may be employed, for example, in contexts in which the multilayer circuit device is to be bent or otherwise flexed during operation or while being positioned within its operational environment or within the structure of a housing, packaging or the like. In addition, in certain contexts, flexible substrates may be beneficial for forming relatively large multilayer circuit structures (e.g., relatively large circuit devices or relatively large structures of multiple circuit devices). Furthermore, flexible substrates may be used in manufacturing processes in which the substrate and/or the manufactured multilayer circuit device are manufactured, packaged, stored or otherwise disposed in one or more windings or coils, for example, for space efficiency. According to embodiments of the present invention, processes for forming vias and multi-layer electronic structures as described herein may employ thin film flexible substrates. In some embodiments, such electronic structures formed with flexible substrates in accordance with aspects of the present invention may be employed in subcutaneous sensors (for subcutaneous implantation in a biological entity). For example, sensors designed for short term usage (in the order of a 1 to 3 days, a week, a month or the like) may employ via and multi-layer technology described herein to provide a relatively thin (narrow) structure by allowing at least some of leads to pass through the substrate, while providing sufficient structural integrity to function properly for at least for the period of intended use.

In optical applications, substrates such as glass and sapphire may be used. For radiation hardened applications a gallium arsenide (GaAs) substrate may be used, and may be provided with a thin dielectric protective layer as required. In advanced applications, the substrate may be a semiconductor substrate such as silicon or GaAs that has an application specific integrated circuit (ASIC) formed therein by conventional lithographic techniques. Thin film dielectric and metal layers may then be formed on the semiconductor substrate in the manner of the present invention to protect the ASIC and to form sensor electrodes and metal patterns for connection of discrete components to the ASIC.

With regard to conductors, it is preferred to utilize thin film conductors that are patterned by shadow masking, photoresist lift-off patterning or chemical etching. However in alternative embodiments conductors may be formed by other methods such as screen printing. The thickness of the conductors may be selected in accordance with a type of joining operation that will be performed on the conductor. For example, conductors that will be resistance welded may be formed of a thick layer, while conductors that will be connected by a low power technique such as wire bonding may be formed of a thin film. Further, while the preferred embodiment provides conductors that are designed for wire bonding, in alternative embodiments the conductors may be patterned for use in other integrated circuit connection structures, such as flip chip and ball grid array structures. The types of conductor materials that may be used are not limited by processing conditions as in some conventional lamination methods, and may therefore be chosen in accordance with the particular application. Conductor materials may include metals such as platinum, gold, silver, copper, titanium, tungsten, and aluminum, as well as alloys, conductive compounds such as silicides, or any other conductor that is applicable in a particular implementation. While the conductors of the preferred embodiment are formed of successive layers of different conducting materials, single conducting materials may also be employed.

In accordance with embodiments of the present invention, one or more thin film dielectric layers in the multiple layer circuit 20 are patterned using sacrificial structures formed by electroplating. While the example embodiment described above utilized a single dielectric thin film having relatively large patterned openings, in alternative embodiments multiple layers of dielectric thin films may be employed, and the dielectric thin films may have very small patterning features such as vias for connecting conductors in adjacent layers. The pattern precision available by using electroplated sacrificial structures allows the dielectric thin films to be formed in smaller or finer patterns, in configurations or shapes that were not practical with shadow masking techniques. Because shadow mask apertures are typically formed by laser drilling methods, the aperture pattern is limited by the laser capabilities. In particular, electroplated sacrificial structures enable formation of vias with diameters smaller than the 0.002 inches and with spacings smaller than 0.006 inches.

Accordingly, using conductive and dielectric thin films and patterning techniques (with electroplated sacrificial structures) in accordance with embodiments of the invention, the dimensions of multilayer substrate features may be significantly reduced compared to those produced through conventional lamination techniques.

While the multilayer substrates of example embodiments described herein are comprised solely of vias, conductors and dielectric layers, alternative embodiments may integrate or embed passive components such as capacitors, resistors and inductors into the multilayer substrate. For example, while the circuit of one example embodiment described herein comprises a discrete capacitor, in alternative embodiments a capacitor may be integrally formed in the multilayer substrate from conductors separated by a deposited dielectric layer. Capacitors may be formed, for example, using a silicon oxide or silicon nitride dielectric layer between conductive plates. Interdigitated capacitors and trench may also be formed. The degree of material control and geometrical precision provided by vacuum deposition and patterning of the dielectric layers allows for precise patterning of the capacitor structure as well as tuning of the capacitor parameters through control of the thickness and dielectric constant of the deposited dielectric layer. Thin film inductors and thin film resistors may also be integrated into the multilayer substrate. Thin film resistors may be patterned from layers of materials such as tantalum nitride (TaN), polysilicon, titanium, cermet or nichrome. In other embodiments, substrate layers may be patterned to form micro-electro-mechanical systems (MEMS) that are integrated with the layers of the substrate. For example, the patterning techniques described above can be used to fabricate structures such as microfluidic structures, valves, reaction chambers, strain gages, micro-actuators, electromechanical sensors arrays and optical detectors. Additional properties of the multilayer substrate such as thermal management, power management, shielding and grounding can be precisely controlled through choices of layout and materials.

A wide variety of embodiments may therefore be implemented in accordance with the invention. In general terms, multilayer circuit substrates fabricated in accordance with example embodiments of the invention are characterized by a base substrate or other support having conductors supported therewith, and at least one layer of a vacuum deposited dielectric thin film overlying the conductors and formed in a pattern with electroplated sacrifical structures. In various implementations, multiple layers of conductors and dielectric thin films may be used, conductors may be formed from thin films or combinations of thin and thick films, multiple layers may be formed on one or both sides of the base substrate, and the base substrate may include hermetic vias.

FIG. 3 shows a generalized process flow for producing a multilayer circuit substrate that encompasses the preferred embodiment, the aforementioned alternative embodiments, and further alternatives. Initially a dielectric base substrate is provided (60). Conductors are then formed on the base substrate (62), preferably by patterning of a blanket layer of a conductive thin film deposited by a vacuum deposition method. Sacrificial structures are then electroplated on the base substrate and conductors (64). The sacrificial structures define areas of the base substrate and conductors that are to be protected during subsequent dielectric deposition. A dielectric thin film is then vacuum deposited on the base substrate, the conductors and the sacrificial structures (66), and the sacrificial structures are removed (68) to leave a patterned dielectric thin film on the conductors and the base substrate. Further processing such as forming additional conductor layers and dielectric layers or mounting of electronic components may be performed.

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, application and removal of antireflective layers, doping, cleaning, planarization, annealing and other tasks, may be performed along with the tasks specifically described above. Further, the processes may be performed selectively on sections of a base substrate or at multiple locations on the base substrate simultaneously. Thus, while the embodiments illustrated in the figures and described above are presently preferred, it should be understood that these embodiments are offered by way of example only. The invention is not limited to a particular embodiment, but extends to various modifications, combinations, and permutations encompassed by the appended claims and their equivalents.

What is claimed is:

1. A method for forming a multilayer circuit device, comprising:
providing a base substrate;
forming at least one conductor on the base substrate;
electroplating at least one sacrificial structure on at least a portion of at least one of the base substrate and conductors to define areas to be protected from deposition of a predetermined material;
depositing a thin film of the predetermined material having a predetermined electrical or structural characteristic on at least a portion of the at least one electroplated sacrificial structure and at least a portion of at least one of the base substrate, and the at least one conductor; and
removing the electroplated sacrificial structures and, after removal of the electroplated sacrificial structures, removing the predetermined material deposited on the electroplated sacrificial structures, to leave a patterned deposited thin film of the predetermined material on at least one of the conductors and the base substrate.

2. The method claimed in claim 1, wherein depositing a thin film of a predetermined material comprises depositing a thin film of a dielectric material.

3. The method claimed in claim 1, wherein depositing a thin film of a predetermined material comprises depositing a thin film of an alumina material.

4. The method claimed in claim 1, wherein electroplating at least one sacrificial structure comprises forming a plurality of sacrificial structures by electroplating an electroplatable material onto at least a portion of at least one of the conductor and base substrate.

5. The method claimed in claim 1, wherein depositing a thin film of a predetermined material comprises vacuum depositing a thin film of the predetermined material.

6. The method claimed in claim 1, wherein depositing a thin film of a predetermined material comprises vacuum depositing a thin film of a dielectric material.

7. The method claimed in claim 1, wherein removing the electroplated sacrificial structures to leave a patterned deposited thin film of the predetermined material comprises applying an etchant to the sacrificial structures.

8. The method claimed in claim 7, wherein applying an etchant to the sacrificial structures comprises selecting and applying an etchant for a period of time, where the etchant is selected and the period of time is selected to cause removal of the electroplated sacrificial material and the predetermined material deposited on the electroplated sacrificial structure without removing so much of the predetermined material as to eliminate its predetermined electrical or structural characteristic.

9. The method claimed in claim 1, wherein electroplating at least one sacrificial structure comprises electroplating a gold material to form at least one electroplated gold sacrificial structure.

10. The method claimed in claim 9, wherein applying an etchant to the sacrificial structures comprises applying a ferric chlorice solution to the sacrificial structures.

11. The method claimed in claim 1, wherein electroplating at least one sacrificial structure comprises electroplating at least one sacrificial structure that has a thickness that is greater than the thickness of the thin film of predetermined material.

12. The method claimed in claim 1, wherein:
depositing a thin film of a predetermined material comprises depositing a thin film of alumina;

electroplating at least one sacrificial structure comprises electroplating a gold material to form at least one electroplated gold sacrificial structure; and applying an etchant to the sacrificial structures comprises applying a ferric chlorice solution to the alumina thin film and gold sacrificial structures.

13. The method claimed in claim 1, wherein providing a base substrate comprises providing a flexible substrate formed of a flexible material.

14. The method claimed in claim 1, wherein the base substrate comprises a hermetic via, and wherein at least one of conductor is formed in contact the hermetic via.

15. A method for forming a multilayer circuit device, comprising:

providing a base substrate having at least one conductor supported thereon;

electroplating at least one sacrificial structure on at least one of the base substrate and the at least one conductor;

depositing a film of a dielectric material on at least a first portion of the at least one electroplated sacrificial structure and over at least a portion of at least one of the base substrate, and the at least one conductor; and removing the electroplated sacrificial structures including the first portion of the at least one electroplated sacrificial structure and, after removal of the electroplated sacrificial structures, removing the dielectric material that had been deposited on the first portion of the at least one electroplated sacrificial structure, to leave a patterned deposited film of the dielectric material on at least a portion of at least one of the conductors and the base substrate.

16. The method claimed in claim 15, wherein depositing a film of a dielectric material comprises depositing a thin film of an alumina material.

17. The method claimed in claim 16, wherein electroplating at least one sacrificial structure comprises forming a plurality of sacrificial structures by electroplating an electroplatable material onto at least a portion of the at least one conductors and base substrate.

18. The method claimed in claim 16, wherein depositing a film of a dielectric material comprises vacuum depositing a thin film of the dielectric material.

19. The method claimed in claim 16, wherein removing the electroplated sacrificial structures to leave a patterned deposited thin film of the dielectric material comprises applying an etchant to the sacrificial structures.

20. The method claimed in claim 19, wherein applying an etchant to the sacrificial structures comprises selecting and applying an etchant for a period of time, where the etchant is selected and the period of time is selected to cause removal of the electroplated sacrificial material and the predetermined material deposited on the electroplated sacrificial structure without removing so much of the dielectric material as to eliminate its electrical or structural characteristic.

21. The method claimed in claim 16, wherein electroplating at least one sacrificial structure comprises electroplating a gold material to form at least one electroplated gold sacrificial structure.

22. The method claimed in claim 21, wherein applying an etchant to the sacrificial structures comprises applying a ferric chloride solution to the sacrificial structures.

23. The method claimed in claim 16, wherein electroplating at least one sacrificial structure comprises electroplating at least one sacrificial structure that has a thickness that is greater than the thickness of the film of dielectric material.

24. The method claimed in claim 16, wherein:

depositing a thin film of a dielectric material comprises depositing a thin film of alumina;

electroplating at least one sacrificial structure comprises electroplating a gold material to form at least one electroplated gold sacrificial structure; and applying an etchant to the sacrificial structures comprises applying a ferric chloride solution to the alumina thin film and gold sacrificial structures.

25. The method claimed in claim 16, wherein providing a base substrate comprises providing a flexible substrate formed of a flexible material.

26. The method claimed in claim 16, wherein the base substrate comprises a hermetic via, and wherein at least one of conductor is formed in contact the hermetic via.

27. The method claimed in claim 1, wherein removing the electroplated sacrificial structures and the predetermined material deposited on the electroplated sacrificial structures forms at least a portion of a pattern in the patterned deposited thin film of the predetermined material.

28. The method claimed in claim 15, wherein removing the electroplated sacrificial structures and the dielectric material deposited on the electroplated sacrificial structures forms at least a portion of a pattern in the patterned film of the dielectric material.

29. The method of claim 1, wherein the patterned deposited thin film of the predetermined material left, consists essentially of one or more portions of the dielectric material that were not deposited on the sacrificial structure.

30. The method of claim 15, wherein the patterned deposited thin film of the predetermined material left, consists essentially of one or more portions of the dielectric material that were not deposited on the sacrificial structure.

31. A method for forming a multilayer circuit device, the method comprising:

providing a base substrate having a surface generally extending along an x-y plane and at least one conductor supported on the surface;

electroplating at least one sacrificial structure on at least one of the base substrate surface and the at least one conductor; and after producing a dielectric layer in a first pattern by depositing and at least partially supporting a film of a dielectric material on a surface of at least a portion of the at least one electroplated sacrificial structure and over at least a portion of at least one of the base substrate surface and the at least one conductor, producing a second pattern of the dielectric layer by removing both the at least one electroplated sacrificial structure and the portion of the dielectric material film of the first pattern deposited and supported on the surface of the at least one electroplated sacrificial structure, wherein the second pattern of the dielectric layer is geometrically different from the first pattern of the dielectric layer with respect to at least one direction in the x-y plane.

32. The method claimed in claim 15, wherein depositing a film of a dielectric material on at least the first portion of the at least one electroplated sacrificial structure comprises depositing the film of dielectric material on top of an upward-facing surface of the first portion of the at least one electroplated sacrificial structure to at least partially support the film of dielectric material on the upward-facing surface of the first portion of the at least one electroplated sacrificial structure.

* * * * *